(12) United States Patent
Takita et al.

(10) Patent No.: US 12,557,467 B2
(45) Date of Patent: Feb. 17, 2026

(54) LIGHT-EMITTING DEVICE, LIGHT-EMITTING APPARATUS, ELECTRONIC DEVICE, AND LIGHTING DEVICE

(71) Applicant: Semiconductor Energy Laboratory Co., Ltd., Kanagawa-ken (JP)

(72) Inventors: Yusuke Takita, Kanagawa (JP); Tsunenori Suzuki, Kanagawa (JP); Naoaki Hashimoto, Kanagawa (JP); Takumu Okuyama, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 144 days.

(21) Appl. No.: 18/615,075

(22) Filed: Mar. 25, 2024

(65) Prior Publication Data

US 2024/0306408 A1 Sep. 12, 2024

Related U.S. Application Data

(63) Continuation of application No. 17/423,665, filed as application No. PCT/IB2020/050320 on Jan. 16, 2020, now Pat. No. 11,943,944.

(30) Foreign Application Priority Data

Jan. 22, 2019 (JP) ................................. 2019-008234

(51) Int. Cl.
*H10K 50/11* (2023.01)
*H10K 59/12* (2023.01)
(Continued)

(52) U.S. Cl.
CPC ......... *H10K 50/11* (2023.02); *H10K 85/6574* (2023.02); *H10K 59/12* (2023.02); *H10K 2101/30* (2023.02); *H10K 2101/40* (2023.02)

(58) Field of Classification Search
CPC .... H10K 50/11; H10K 85/6574; H10K 59/12; H10K 2101/30; H10K 2101/40;
(Continued)

(56) References Cited

U.S. PATENT DOCUMENTS 8,841,655 B2 9/2014 Okamoto
10,193,094 B2 1/2019 Stoessel et al.
(Continued)

FOREIGN PATENT DOCUMENTS

CN 106432157 A 2/2017
CN 107129459 A 9/2017
(Continued)

OTHER PUBLICATIONS

International Search Report (Application No. PCT/IB2020/050320) Dated Apr. 7, 2020.
(Continued)

*Primary Examiner* — Douglas W Owens
(74) *Attorney, Agent, or Firm* — Husch Blackwell LLP

(57) ABSTRACT

A novel light-emitting device is provided. Alternatively, a light-emitting device having a long driving lifetime at high temperature is provided. The light-emitting device includes an anode, a cathode, and an EL layer positioned between the anode and the cathode. The EL layer includes a first layer, a second layer, a third layer, and a light-emitting layer in this order from the anode side. The first layer includes a first organic compound and a second organic compound. The second layer includes a third organic compound. The third layer includes a fourth organic compound. The light-emitting layer includes a fifth organic compound and an emission center substance. The first organic compound exhibits an electron-accepting property with respect to the second organic compound. A difference between HOMO levels of
(Continued)

the fourth organic compound and the fifth organic compound is less than or equal to 0.24 eV.

21 Claims, 28 Drawing Sheets

(51) Int. Cl.
  *H10K 85/60* (2023.01)
  *H10K 101/30* (2023.01)
  *H10K 101/40* (2023.01)
(58) Field of Classification Search
  CPC .. H10K 50/156; H10K 85/615; H10K 85/631; H10K 85/636; H10K 85/6572
  See application file for complete search history.

(56) References Cited

U.S. PATENT DOCUMENTS

| | | | |
|---|---|---|---|
| 10,636,976 B2 | 4/2020 | Seo et al. | |
| 2008/0007165 A1 | 1/2008 | Suzuki et al. | |
| 2016/0035992 A1 | 2/2016 | Stoessel et al. | |
| 2017/0040535 A1 | 2/2017 | Ogita et al. | |
| 2017/0062734 A1 | 3/2017 | Suzuki et al. | |
| 2017/0222156 A1 | 8/2017 | Kawakami et al. | |
| 2017/0250346 A1 | 8/2017 | Seo et al. | |
| 2017/0309852 A1* | 10/2017 | Seo | H10K 50/818 |
| 2017/0338436 A1* | 11/2017 | Mitsumori | H10K 50/16 |
| 2017/0352830 A1* | 12/2017 | Kishimoto | H10K 30/865 |
| 2018/0076391 A1 | 3/2018 | Huang et al. | |
| 2021/0126213 A1 | 4/2021 | Seo et al. | |
| 2021/0139496 A1 | 5/2021 | Takeda. et al. | |
| 2021/0249619 A1 | 8/2021 | Seo et al. | |
| 2022/0194954 A1* | 6/2022 | Takeda | H10K 85/6576 |
| 2024/0023437 A1* | 1/2024 | Lee | C09K 11/06 |

FOREIGN PATENT DOCUMENTS

| | | |
|---|---|---|
| CN | 107925009 A | 4/2018 |
| CN | 108604641 A | 9/2018 |
| CN | 109153685 A | 1/2019 |
| CN | 110637020 A | 12/2019 |
| JP | 2016-520999 | 7/2016 |
| JP | 2017-036267 A | 2/2017 |
| JP | 2017-076780 A | 4/2017 |
| JP | 2017-139457 A | 8/2017 |
| JP | 2017-155040 A | 9/2017 |
| JP | 6339749 | 6/2018 |
| JP | 2019-085387 A | 6/2019 |
| KR | 2015-0140356 A | 12/2015 |
| KR | 2017-0017761 A | 2/2017 |
| KR | 2017-0101128 A | 9/2017 |
| KR | 2018-0044985 A | 5/2018 |
| KR | 2018-0107159 A | 10/2018 |
| KR | 2019-0075009 A | 6/2019 |
| KR | 2020-0006571 A | 1/2020 |
| TW | 201504201 | 2/2015 |
| TW | 201724611 | 7/2017 |
| TW | 201736357 | 10/2017 |
| TW | 201811753 | 4/2018 |
| TW | 201837043 | 10/2018 |
| WO | WO-2011/065136 | 6/2011 |
| WO | WO-2014/166572 | 10/2014 |
| WO | WO-2017/037559 | 3/2017 |
| WO | WO-2017/130079 | 8/2017 |
| WO | WO-2018/185571 | 10/2018 |
| WO | WO-2018/207135 | 11/2018 |

OTHER PUBLICATIONS

Written Opinion (Application No. PCT/IB2020/050320) Dated Apr. 7, 2020.
Taiwanese Office Action (Application No. 109101347) Dated Sep. 27, 2023.

* cited by examiner

FIG. 1A1
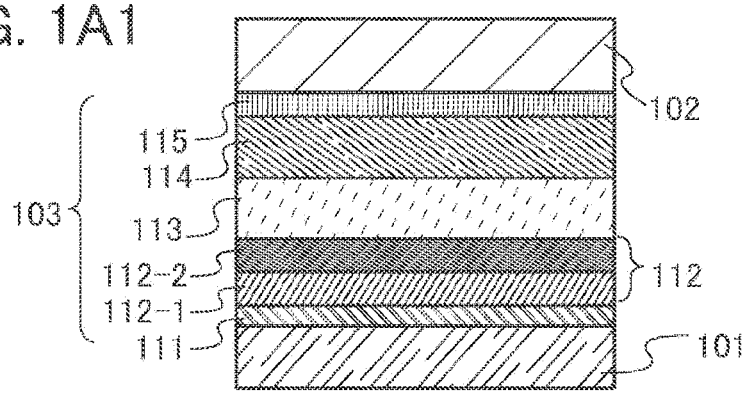
FIG. 1A2
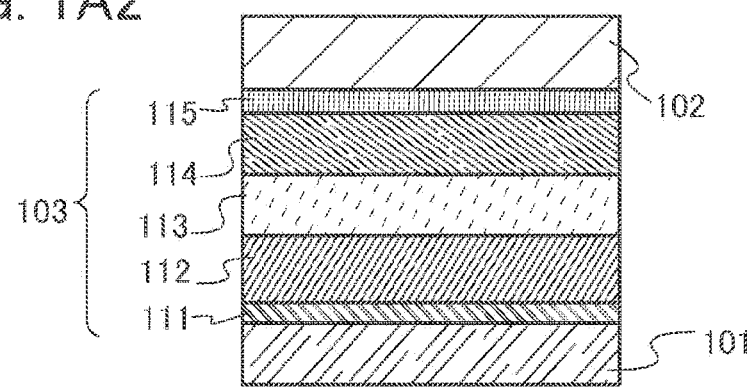
FIG. 1B
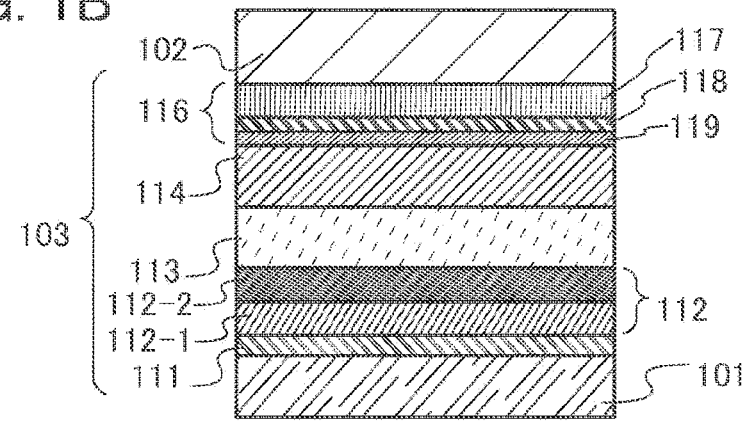
FIG. 1C
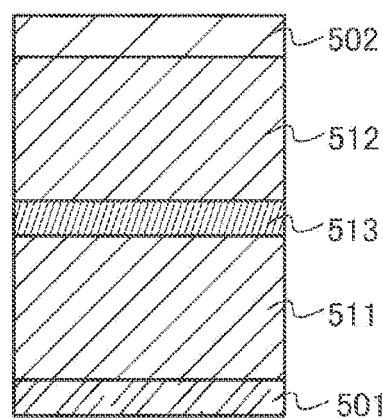

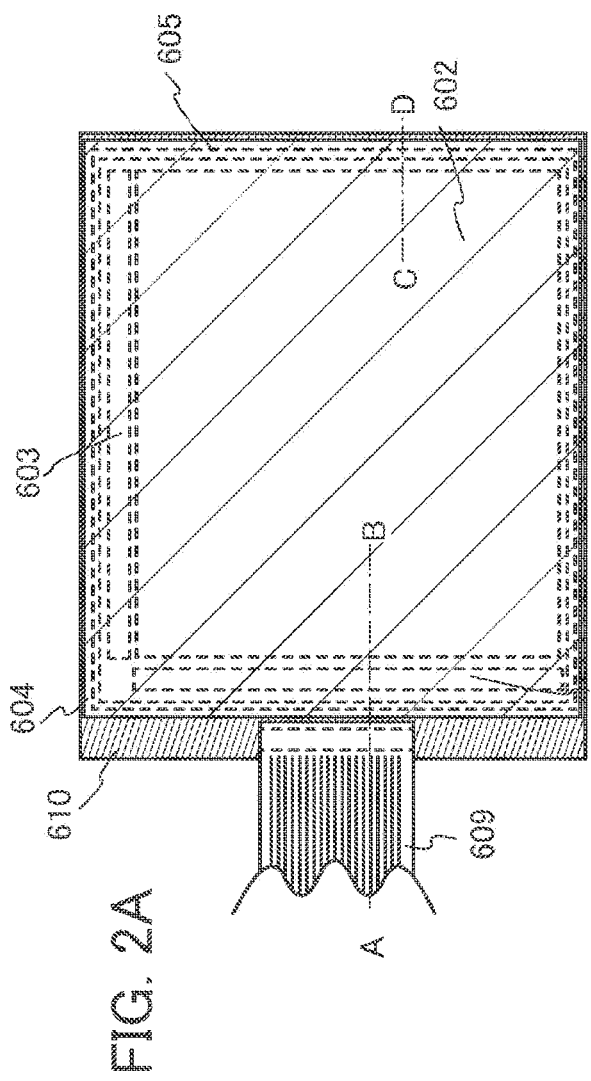
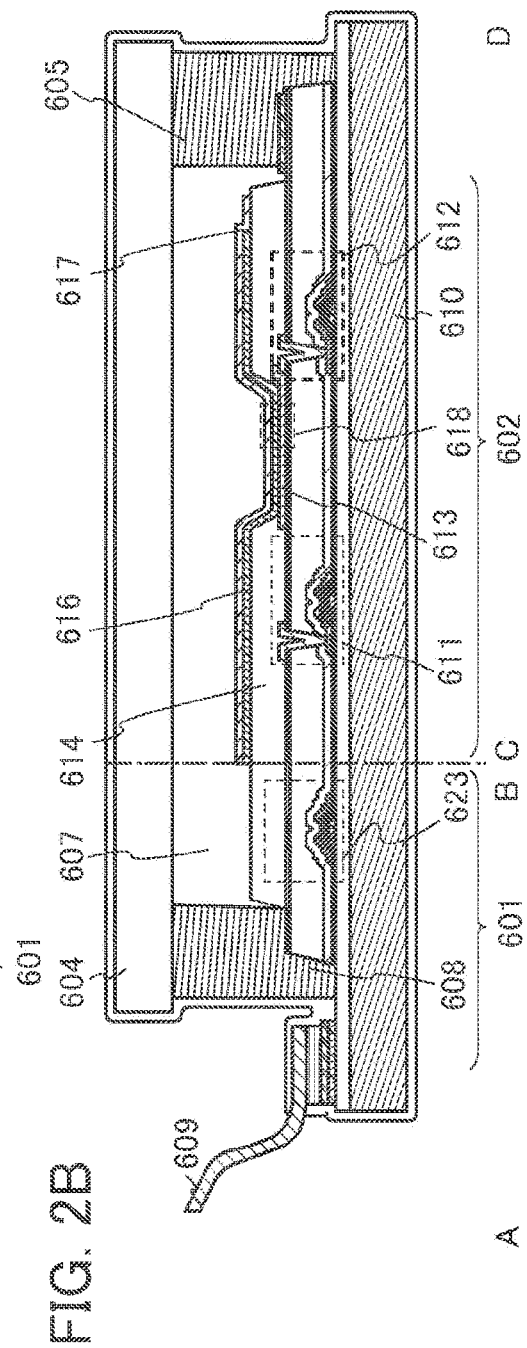

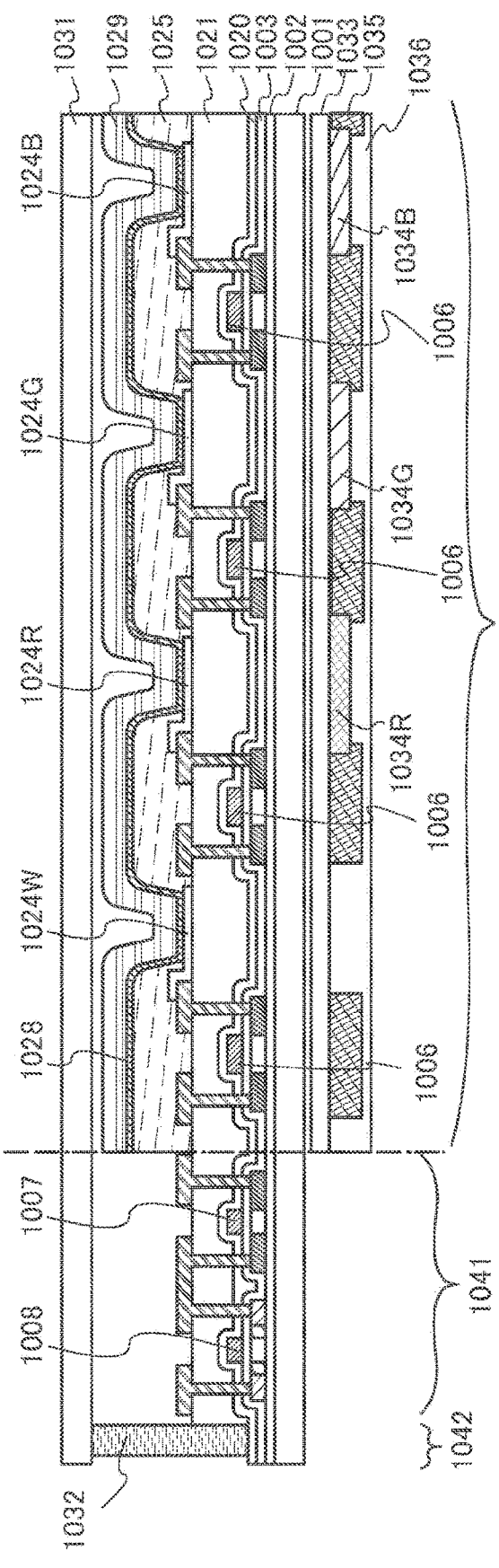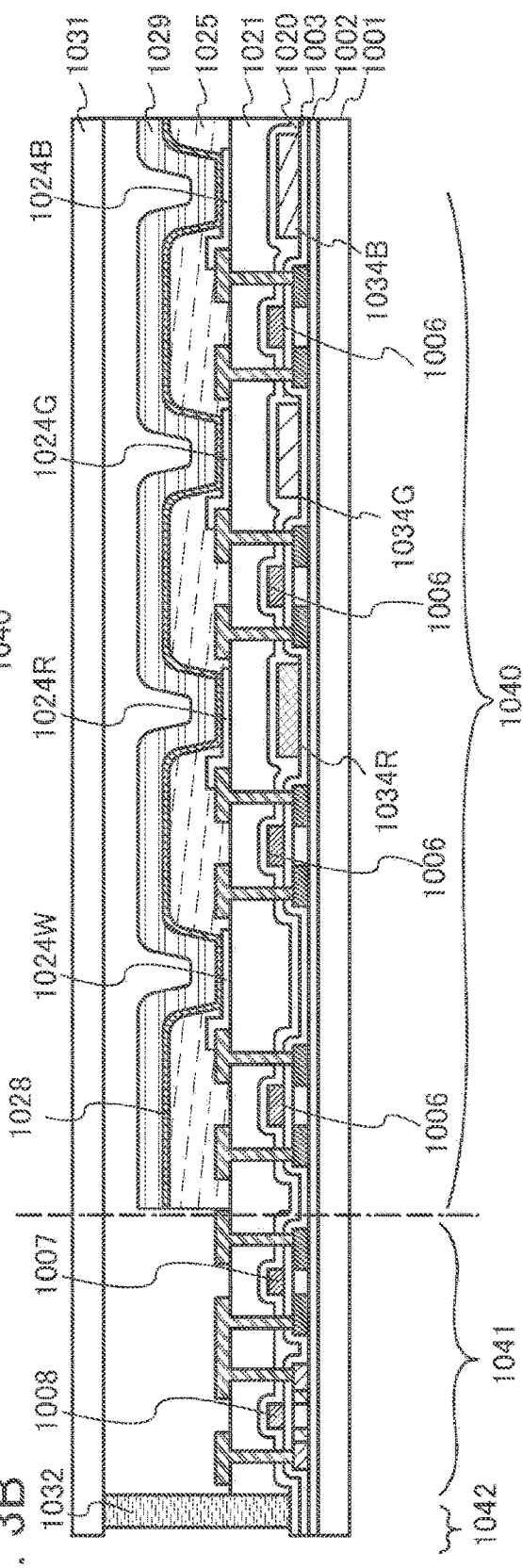

FIG. 7A
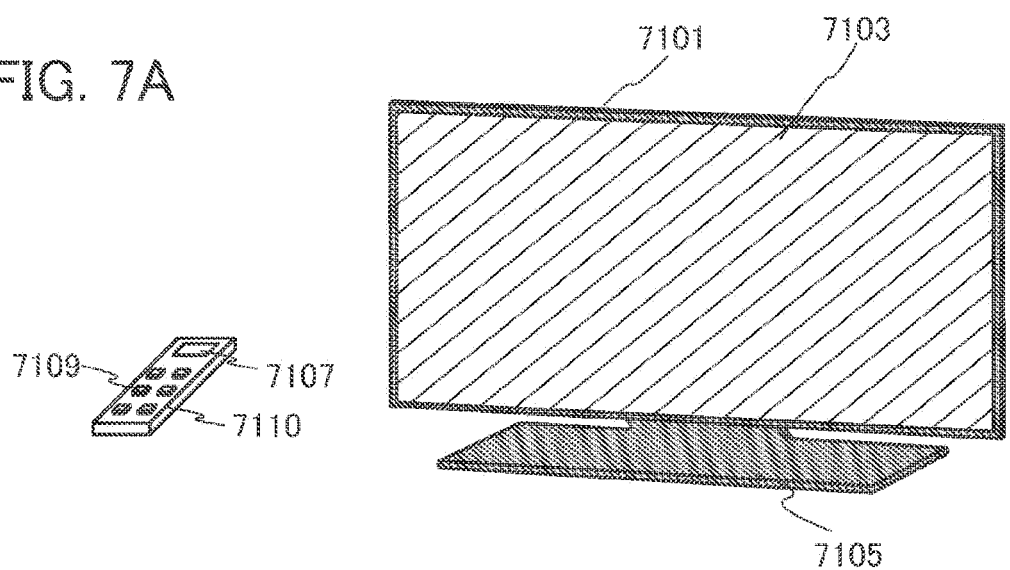
FIG. 7B1
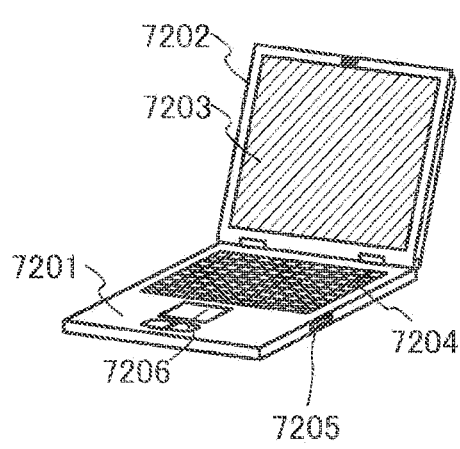
FIG. 7B2
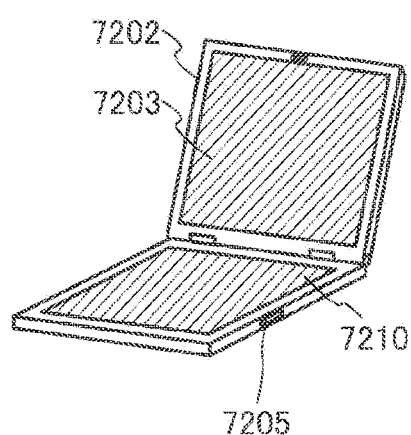
FIG. 7C
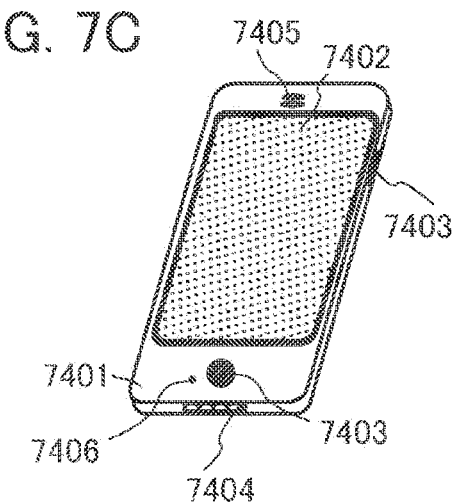

LIGHT-EMITTING DEVICE, LIGHT-EMITTING APPARATUS, ELECTRONIC DEVICE, AND LIGHTING DEVICE

This application is a continuation of copending U.S. application Ser. No. 17/423,665, filed on Jul. 16, 2021 which is a 371 of international application PCT/IB2020/050320 filed on Jan. 16, 2020 which are all incorporated herein by reference.

TECHNICAL FIELD

Embodiments of the present invention relate to a light-emitting element, a light-emitting device, a display module, a lighting module, a display device, a light-emitting apparatus, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, an imaging device, a driving method thereof, and a manufacturing method thereof.

BACKGROUND ART

Light-emitting devices (organic EL devices) including organic compounds and utilizing electroluminescence (EL) have been put to more practical use. In the basic structure of such light-emitting devices, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

Such light-emitting devices are of self-light-emitting type and thus have advantages over liquid crystal material when used for pixels of a display in that visibility is high and a backlight is not required; therefore, such light-emitting devices are suitable as flat panel display elements. Displays including such light-emitting devices are also highly advantageous in that they can be thin and lightweight. Moreover, such light-emitting devices also have a feature that response speed is extremely fast.

Since light-emitting layers of such light-emitting devices can be successively formed two-dimensionally, planar light emission can be achieved. This feature is difficult to realize with point light sources typified by incandescent lamps and LEDs or linear light sources typified by fluorescent lamps. Thus, light-emitting devices also have great potential as planar light sources, which can be applied to lighting devices and the like.

Displays or lighting devices including light-emitting devices can be suitably used for a variety of electronic devices as described above, and research and development of light-emitting devices has progressed for higher efficiency or longer lifetimes.

In a structure disclosed in Patent Document 1, a hole-transport material whose HOMO level is between the HOMO level of a first hole-injection layer and the HOMO level of a host material is provided between a light-emitting layer and a first hole-transport layer in contact with the hole-injection layer.

Although the characteristics of light-emitting devices have been improved considerably, advanced requirements for various characteristics including efficiency and durability are not yet satisfied.

REFERENCE

Patent Document

[Patent Document 1] PCT International Publication No. WO2011/065136

DISCLOSURE OF INVENTION

In view of the above, an object of one embodiment of the present invention is to provide a novel light-emitting device. Another object of one embodiment of the present invention is to provide a light-emitting device having a long driving lifetime at high temperature.

Another object of one embodiment of the present invention is to provide a light-emitting apparatus, an electronic device, and a display device each having a long driving lifetime at high temperature.

It is only necessary that at least one of the above-described objects be achieved in the present invention.

One embodiment of the present invention is a light-emitting device including an anode, a cathode, and an EL layer between the anode and the cathode. The EL layer includes a first layer, a second layer, a third layer, and a light-emitting layer in this order from the anode side. The first layer includes a first organic compound and a second organic compound. The second layer includes a third organic compound. The third layer includes a fourth organic compound. The light-emitting layer includes a fifth organic compound and an emission center substance. The first organic compound exhibits an electron-accepting property with respect to the second organic compound. A difference between a HOMO level of the fourth organic compound and a HOMO level of the fifth organic compound is less than or equal to 0.24 eV.

Another embodiment of the present invention is a light-emitting device having the above structure, in which a HOMO level of the second organic compound is greater than or equal to −5.7 eV and less than or equal to −5.4 eV.

Another embodiment of the present invention is a light-emitting device including an anode, a cathode, and an EL layer between the anode and the cathode. The EL layer includes a first layer, a third layer, and a light-emitting layer in this order from the anode side. The first layer includes a first organic compound and a second organic compound. The third layer includes a fourth organic compound. The light-emitting layer includes a fifth organic compound and an emission center substance. The first organic compound exhibits an electron-accepting property with respect to the second organic compound. A HOMO level of the second organic compound is greater than or equal to −5.7 eV and less than or equal to −5.4 eV. A difference between a HOMO level of the fourth organic compound and a HOMO level of the fifth organic compound is less than or equal to 0.24 eV.

Another embodiment of the present invention is a light-emitting device having the above structure, in which the HOMO level of the fifth organic compound is less than or equal to −5.75 eV.

Another embodiment of the present invention is a light-emitting device having the above structure, in which the fifth organic compound does not include a heteroaromatic ring in its molecular structure.

Another embodiment of the present invention is a light-emitting device having the above structure, in which the fifth organic compound is formed of only hydrocarbon.

Another embodiment of the present invention is a light-emitting device having the above structure, in which a difference between the HOMO level of the fourth organic compound and the HOMO level of the fifth organic compound is less than or equal to 0.20 eV.

Another embodiment of the present invention is a light-emitting device having the above structure, in which a difference between the HOMO level of the fourth organic compound and the HOMO level of the fifth organic compound is less than or equal to 0.16 eV.

Another embodiment of the present invention is a light-emitting device having the above structure, in which the emission center substance exhibits fluorescence with an emission peak wavelength of less than or equal to 480 nm.

Another embodiment of the present invention is a light-emitting device having the above structure, in which the emission center substance includes a naphthobisbenzofuran skeleton.

Another embodiment of the present invention is a light-emitting apparatus including the light-emitting device, and at least one of a transistor and a substrate.

Another embodiment of the present invention is an electronic device including the light-emitting apparatus and at least one of a sensor, an operation button, a speaker, and a microphone.

Another embodiment of the present invention is a lighting device including the light-emitting apparatus and a housing.

Note that the light-emitting apparatus in this specification includes, in its category, an image display device that uses a light-emitting device. The light-emitting apparatus may include, in its category, a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. The light-emitting apparatus may be included in a lighting device or the like.

One embodiment of the present invention can provide a novel light-emitting device. Another embodiment of the present invention can provide a light-emitting device having a long driving lifetime at high temperature.

Another embodiment of the present invention can provide a light-emitting apparatus, an electronic device, and a display device each having a long driving lifetime at high temperature.

Note that the descriptions of the effects do not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 1A1, 1A2, 1B, and 1C are schematic views of a light-emitting device;

FIGS. 2A and 2B are conceptual views of an active-matrix light-emitting apparatus;

FIGS. 3A and 3B are conceptual views of an active-matrix light-emitting apparatus;

FIGS. 7A, 7B1, 7B2, and 7C each illustrate an electronic device;

BEST MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Embodiment 1

In an organic EL device, in order to facilitate carrier injection from an anode, a hole-injection layer is often provided in contact with the anode.

The hole-injection layer contains a material having a high capability to accept electrons from an organic compound (an acceptor material). Although the acceptor material can be either an organic compound or an inorganic compound, an organic compound is widely used as the acceptor material because it is easy to evaporate and handle.

On the other hand, it is known that the acceptor property of an organic compound used as the acceptor material is not as high as that of an inorganic compound. For this reason, as a material that is used for the hole-injection layer in combination with the acceptor material and a material used for the hole-transport layer that is stacked to be adjacent to the hole-injection layer, a hole-transport material with a shallow HOMO level is selected in order to facilitate the extraction of electrons. Therefore, a hole-transport material with a shallow HOMO level tends to be used also in the adjacent hole-transport layer, in relation to a driving voltage and the like.

Here, in a blue fluorescent light-emitting device, a host material with a deep HOMO level is usually used in order to efficiently excite an emission center substance that exhibits blue fluorescence. Accordingly, in the light-emitting device in which an organic compound is used as the acceptor material, there is a big difference between HOMO levels of the host material and the hole-transport material used for the hole-transport layer or an electron-blocking layer that is in contact with a light-emitting layer. The present inventors have found that this difference largely affects the driving lifetime at high temperature.

Figure 21A:
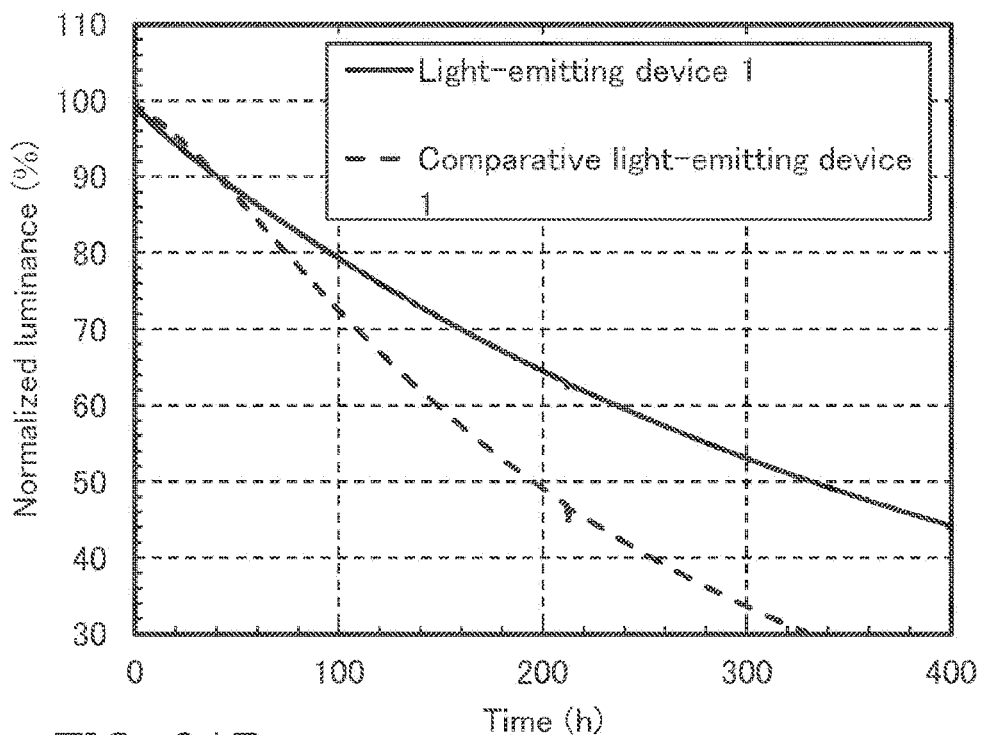
FIGS. 21A and 21B each show time dependence of normalized luminance of the light-emitting device 1 and the comparative light-emitting device 1.
Figure 21B:
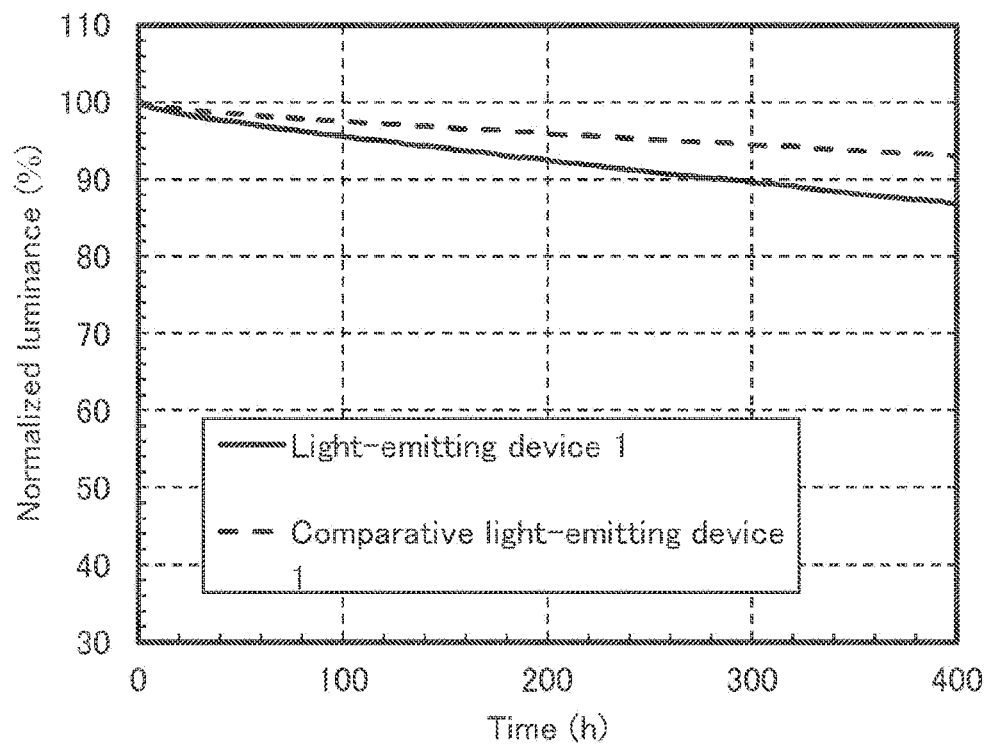

FIG. 21B shows a change in luminance over driving time, at room temperature, of a light-emitting device in which a difference between HOMO levels of the host material and the hole-transport material used for the hole-transport layer (or an electron-blocking layer) that is in contact with the light-emitting layer is greater than 0.24 eV (a comparative light-emitting device 1) and a light-emitting device in which the difference is less than or equal to 0.24 eV (a light-emitting device 1). FIG. 21A shows a change in luminance over driving time, at 85° C., of a light-emitting devices having the same device structures as the above light-emitting devices. Note that in these graphs, luminance is normalized with the initial luminance. Example 1 is referred to for the details of the device structure.

In FIG. 21B showing the results of driving at room temperature, the lifetime of the comparative light-emitting device 1 is longer than that of the light-emitting device 1, whereas in FIG. 21A showing the results of driving at high temperature, the lifetime of the comparative light-emitting device 1 is much shorter than that of the light-emitting device 1. Furthermore, the degradation curve of the light-emitting device 1 almost follows the single exponential function both at room temperature and at high temperature, whereas the degradation curve of the comparative light-emitting device 1 deviates from the single exponential function at high temperature. This indicates a possibility that the comparative light-emitting device 1 degrades in a different mechanism in high-temperature driving.

FIGS. 1A1 and 1A2 illustrate a light-emitting device of one embodiment of the present invention. The light-emitting device of one embodiment of the present invention includes an anode 101, a cathode 102, and an EL layer 103. The EL layer includes a hole-injection layer 111, a hole-transport layer 112, and a light-emitting layer 113.

Although FIGS. 1A1 and 1A2 additionally illustrate an electron-transport layer 114 and an electron-injection layer 115 in the EL layer 103, the structure of the light-emitting device is not limited thereto. As long as the above-described components are included, a layer having another function may be included.

The hole-injection layer 111 includes a first organic compound and a second organic compound. The first organic compound exhibits an electron-accepting property with respect to the second organic compound.

As the first organic compound, organic compounds having an electron-withdrawing group (in particular, a cyano group or a halogen group such as a fluoro group) can be used, for example. A substance that exhibits an electron-accepting property with respect to the second organic compound is selected from such organic compounds as appropriate. Examples of such an organic compound include 7,7,8,8-tetracyano-2,3,5,6-tetrafluoroquinodimethane (abbreviation: chloranil, F4-TCNQ), 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyrene-2-ylidene)malononitrile. A compound in which electron-withdrawing groups are bonded to a condensed aromatic ring having a plurality of heteroatoms, such as HAT-CN, is preferred because it is thermally stable. A [3]radialene derivative having an electron-withdrawing group (in particular, a cyano group or a halogen group such as a fluoro group) has a very high electron-accepting property and thus is preferred. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

The second organic compound is preferably an organic compound having a hole-transport property and any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the second organic compound having an N,N-bis (4-biphenyl)amino group is preferred because a light-emitting device having a long lifetime can be fabricated. Specific examples of the second organic compound include N-(4-biphenyl)-6, N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4''-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4-(2; 1'-binaphthyl-6-yl)-4',4''-diphenyltriphenylamine (abbreviation: BBAαNβNB), 4,4'-diphenyl-4''-(7;1'-binaphthyl-2-yl)triphenylamine (abbreviation: BBAαNβNB-03), 4,4'-diphenyl-4''-(7-phenyl)naphthyl-2-yltriphenylamine (abbreviation: BBAPβNB-03), 4-(6;2'-binaphthyl-2-yl)-4',4''-diphenyltriphenylamine (abbreviation: BBA(βN2)B), 4-(2;2'-binaphthyl-7-yl)-4',4''-diphenyltriphenylamine (abbreviation: BBA(βN2)B-03), 4-(1;2'-binaphthyl-4-yl)-4',4''-diphenyltriphenylamine (abbreviation: BBAβNαNB), 4-(1; 2'-binaphthyl-5-yl)-4',4''-diphenyltriphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-(1-naphthyl)-4'-phenyltriphenylamine (abbreviation: αNBA1BP), 4,4'-bis (1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl) triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl] triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl) triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), and N-(1,1'-biphenyl-4-yl)-9,9-dimethyl-N-[4-(9-phenyl-9H-carbazol-3-yl)phenyl]-9H-fluoren-2-amine (abbreviation: PCBBiF).

The second organic compound preferably has a relatively deep HOMO level of greater than or equal to −5.7 eV and less than or equal to −5.4 eV, like the above-described material. In addition, the HOMO level of the second organic compound is preferably less than a LUMO level of the first organic compound for easy hole induction, and the difference therebetween is preferably greater than or equal to 0.15 eV, more preferably greater than or equal to 0.20 eV.

The hole-transport layer 112 includes a first hole-transport layer 112-1 and a second hole-transport layer 112-2. The first hole-transport layer 112-1 is closer to the anode 101 than the second hole-transport layer 112-2 is.

The first hole-transport layer 112-1 includes a third organic compound, and the second hole-transport layer 112-2 includes a fourth organic compound. The third organic compound and the fourth organic compound preferably have a hole-transport property. As the third organic compound and the fourth organic compound, the organic compound that can be used as the second organic compound can be similarly used. In this case, it is preferable that the HOMO level of the third organic compound be deeper than or equal to that of the second organic compound, and the HOMO level of the fourth organic compound be deeper than or equal to that of the third organic compound. Note that a difference between HOMO levels of the second organic compound and the third organic compound and a difference between HOMO levels of the third organic compound and the fourth organic compound are each preferably less than or equal to 0.2 eV.

Preferably, the second organic compound to the fourth organic compound each have a hole-transport skeleton. A carbazole skeleton, a dibenzofuran skeleton, a dibenzothiophene skeleton, and an anthracene skeleton, with which the HOMO levels of the organic compounds do not become too shallow, are preferably used as the hole-transport skeleton. Materials of adjacent layers (e.g., the second organic compound and the third organic compound or the third organic compound and the fourth organic compound) preferably have the same hole-transport skeleton, in which case holes can be injected smoothly. In particular, a dibenzofuran skeleton is preferably used as the hole-transport skeleton.

Furthermore, materials contained in adjacent layers (e.g., the second organic compound and the third organic compound or the third organic compound and the fourth organic compound) are preferably the same, in which case holes can be injected smoothly. In particular, the second organic compound and the third organic compound are preferably the same material.

When the second organic compound has a relatively deep HOMO level of greater than or equal to −5.7 eV and less than or equal to −5.4 eV, the light-emitting device can have favorable characteristics even when the hole-transport layer 112 is formed of one layer as illustrated in FIG. 1A2, instead of two layers as illustrated in FIG. 1A1. That is, the first hole-transport layer 112-1 is not provided and the second hole-transport layer 112-2 is provided in contact with the hole-injection layer 111. When the second organic compound has a deep HOMO level, a difference between HOMO levels of the second organic compound and the host material is small and thus the light-emitting device of one embodiment of the present invention can be achieved even when the hole-transport layer 112 has a single-layer structure.

It is preferable that the second hole-transport layer 112-2 also function as an electron-blocking layer.

The light emitting layer 113 includes a fifth organic compound and the emission center substance. The fifth organic compound is a host material in which the emission center substance is dispersed.

As the emission center substance, fluorescent substances, phosphorescent substances, substances exhibiting thermally activated delayed fluorescence (TADF), or other light-emitting materials may be used. Furthermore, the light-emitting layer 113 may be a single layer or include a plurality of layers including different light-emitting materials. Note that one embodiment of the present invention is more preferable in the case where the light-emitting layer 113 exhibits fluorescence, specifically, blue fluorescence.

Examples of the material that can be used as a fluorescent substance in the light-emitting layer 113 are as follows. Fluorescent substances other than those can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferred because of their high hole-trapping properties, high emission efficiency, and high reliability.

Examples of the material that can be used when a phosphorescent substance is used as the emission center substance in the light-emitting layer 113 are as follows.

The examples include: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These compounds emit blue phosphorescence and have a peak of the emission spectrum at 440 nm to 520 nm.

Other examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir (mppm)₂(acac)]), (acetylacetonato)bis(6-tert-butyl-4-phenylpyrimidinato)iridium(III) (abbreviation: [Ir(tBuppm)₂(acac)]), (acetylacetonato)bis[6-(2-norbornyl)-4-phenylpyrimidinato]iridium(III) (abbreviation: [[Ir(nbppm)₂(acac)]), (acetylacetonato)bis[5-methyl-6-(2-methylphenyl)-4-phenylpyrimidinato]iridium(III) (abbreviation: [Ir(mpmppm)₂(acac)]), and (acetylacetonato)bis(4,6-diphenylpyrimidinato)iridium(III) (abbreviation: [Ir(dppm)₂(acac)]); organometallic iridium complexes having a pyrazine skeleton, such as (acetylacetonato)bis(3,5-dimethyl-2-phenylpyrazinato)iridium(III) (abbreviation: [Ir(mppr-Me)₂(acac)]) and (acetylacetonato)bis(5-isopropyl-3-methyl-2-phenylpyrazinato)iridium(III) (abbreviation: [Ir(mppr-iPr)₂(acac)]); organometallic iridium complexes having a pyridine skeleton, such as tris(2-phenylpyridinato-N,C²')iridium(III) (abbreviation: [Ir(ppy)₃]), bis(2-phenylpyridinato-N,C²')iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium(III) (abbreviation: [Ir(bzq)₃]), tris(2-phenylquinolinato-N,C²')iridium(III) (abbreviation: [Ir(pq)₃]), and bis(2-phenylquinolinato-N,C²')iridium(III) acetylacetonate (abbreviation: [Ir(pq)₂(acac)]); and a rare earth metal complex such as tris(acetylacetonato)(monophenanthroline)terbium(III) (abbreviation: [Tb(acac)₃(Phen)]). These are mainly compounds that emit green phosphorescence and have a peak of the emission spectrum at 500 nm to 600 nm. Note that organometallic iridium complexes having a pyrimidine skeleton have distinctively high reliability and emission efficiency and thus are especially preferable.

Other examples include organometallic iridium complexes having a pyrimidine skeleton, such as (diisobutyrylmethanato)bis[4,6-bis(3-methylphenyl)pyrimidinatoiridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), and bis[4,6-di(naphthalen-1-yl)pyrimidinato(dipivaloylmethanato)iridium(III) (abbreviation: [Ir(d1npm)₂(dpm)]); organometallic iridium complexes having a pyrazine skeleton, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), and (acetylacetonato)bis[2,3-bis(4-fluorophenyl)quinoxalinatoiridium(III) (abbreviation: [Ir(Fdpq)₂(acac)]); organometallic iridium complexes having a pyridine skeleton, such as tris(1-phenylisoquinolinato-N,C²')iridium(III) (abbreviation: [Ir(piq)₃]) and bis(1-phenylisoquinolinato-N,C²')iridium(III) acetylacetonate (abbreviation: [Ir(piq)₂(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)₃(Phen)]) and tris[1-(2-thenoyl)-3,3,3-trifluoroacetonato](monophenanthroline)europium(III) (abbreviation: [Eu(TTA)₃(Phen)]). These compounds emit red phosphorescence having a peak of the emission spectrum at 600 nm to 700 nm. Furthermore, the organometallic iridium complexes having a pyrazine skeleton can provide red light emission with favorable chromaticity.

Besides the above phosphorescent compounds, known phosphorescent materials may be selected and used.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex (SnF₂(Proto IX)), a mesoporphyrin-tin fluoride complex (SnF₂(Meso IX)), a hematoporphyrin-tin fluoride complex (SnF₂(Hemato IX)), a coproporphyrin tetramethyl ester-tin fluoride complex (SnF₂(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂OEP), which are represented by the following structural formulae.

[Chemical Formula 1]

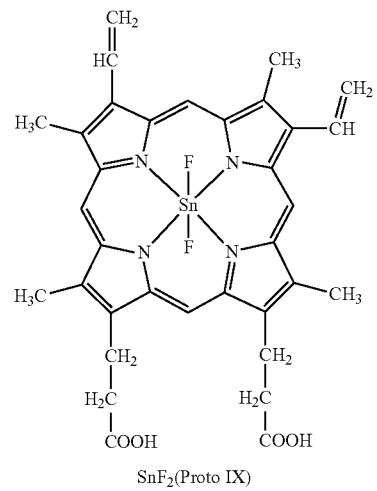

SnF₂(Proto IX)

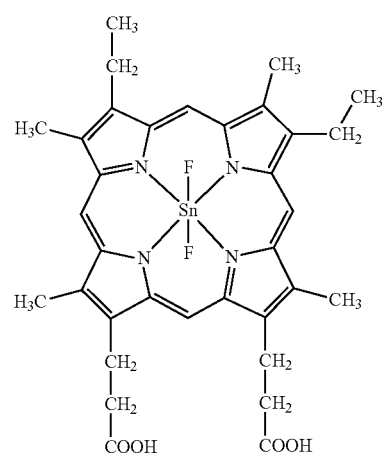

SnF₂(Meso IX)

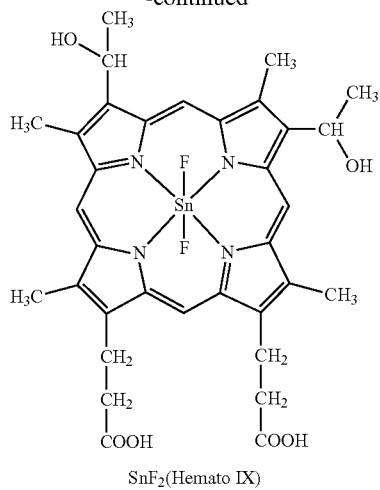

SnF₂(Hemato IX)

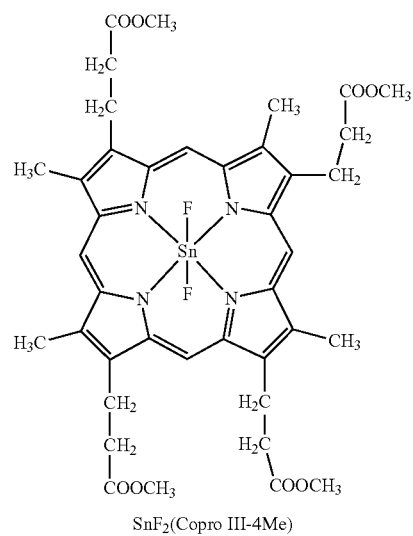

SnF₂(Copro III-4Me)

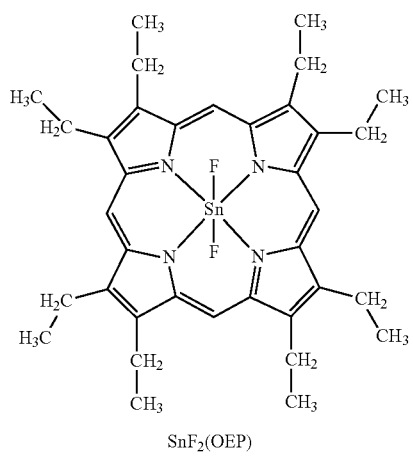

SnF₂(OEP)

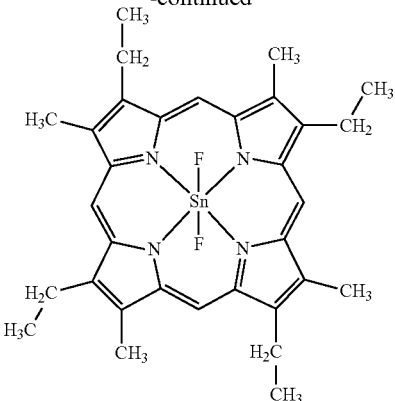

SnF₂(Etio I)

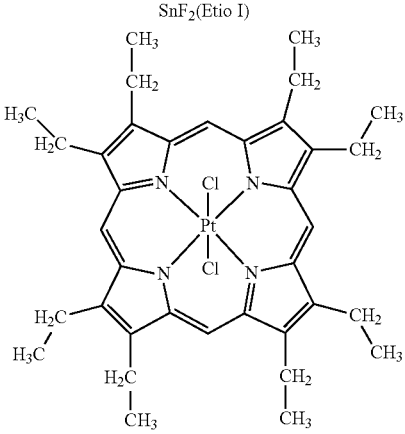

PtCl₂OEP

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazine-10-yl)phenyl]-4,6-diphenyl-1,3,5-triazine (abbreviation: PXZ-TRZ), 3-[4-10(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[ acridin-9,9'-anthracen]-10'-one (abbreviation: ACRSA) can be used. Such a heterocyclic compound is preferred because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high accepting properties and reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 2]

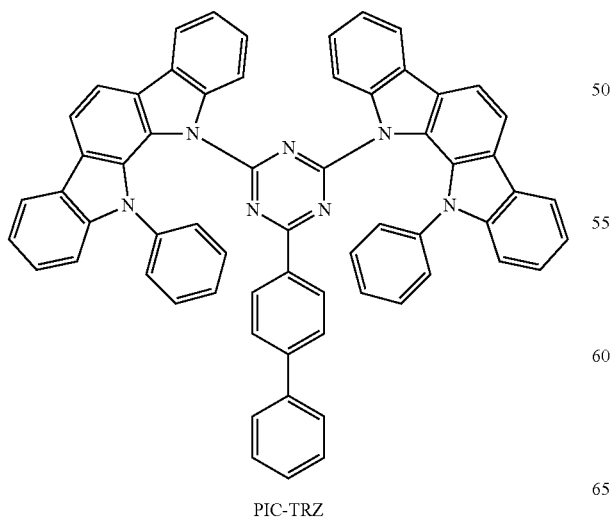

PIC-TRZ

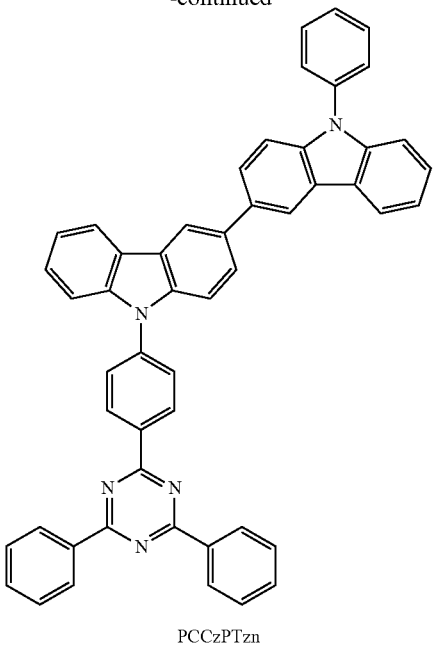

PCCzPTzn

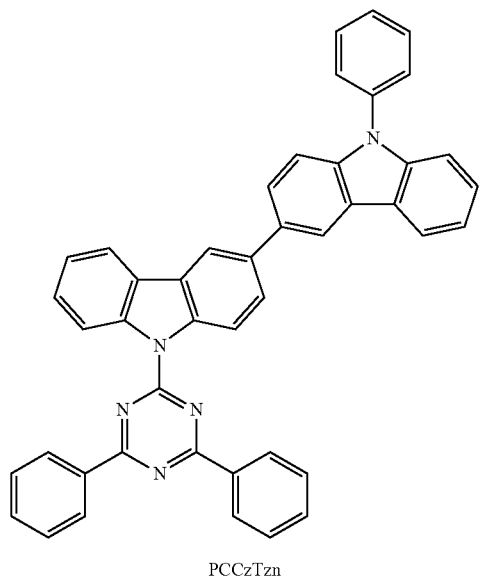

PCCzTzn

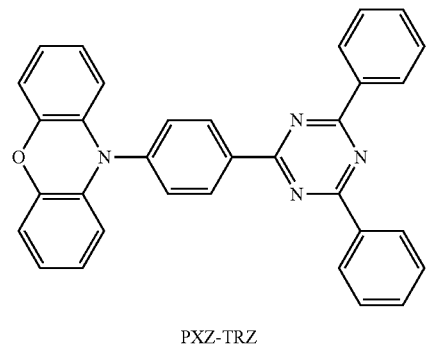

PXZ-TRZ

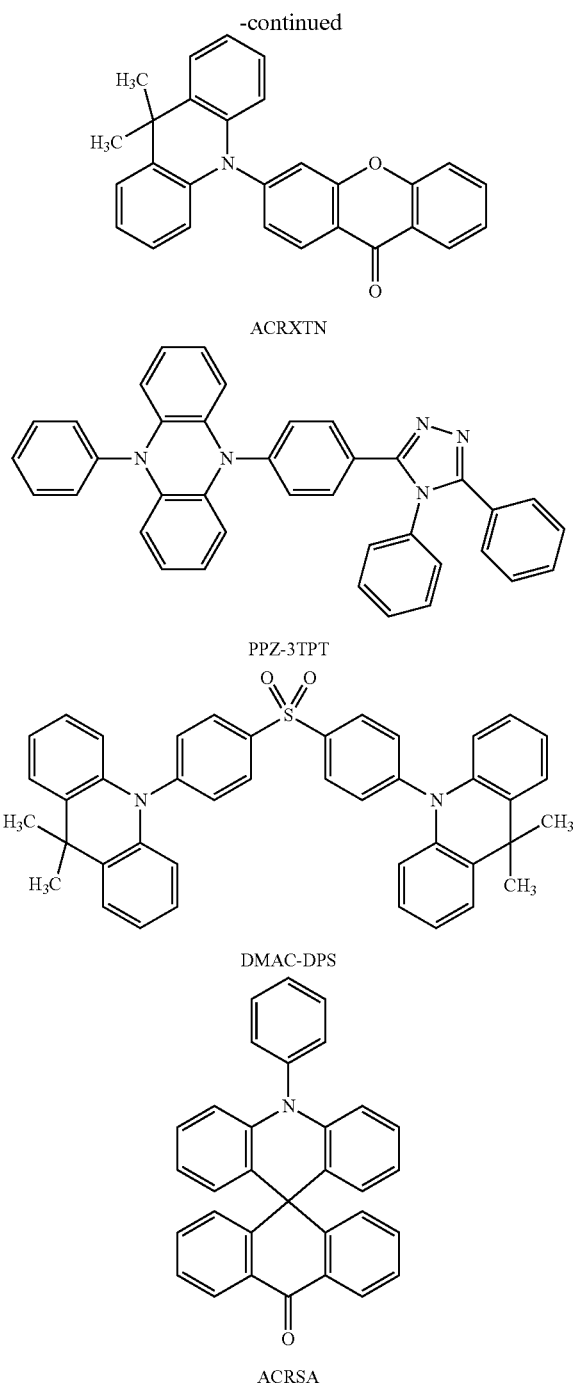

ACRXTN

PPZ-3TPT

DMAC-DPS

ACRSA

Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When the TADF material is used as an emission center substance, the S1 level and the T1 level of the host material are preferably higher than those of the TADF material.

As the host material in the light-emitting layer 113, various carrier-transport materials such as materials having an electron-transport property, materials having a hole-transport property, and the TADF materials can be used.

The material having a hole-transport property is preferably an organic compound having an aromatic amine skeleton or a π-electron rich heteroaromatic ring skeleton. Examples of such a compound is as follows: 4,4'-bis[N-(1-naphthyl)-N-phenylamino]biphenyl (abbreviation: NPB), N,N'-bis(3-methylphenyl)-N,N'-diphenyl-[1,1'-biphenyl]-4, 4'-diamine (abbreviation: TPD), 4,4'-bis[N-(spiro-9,9'-bifluoren-2-yl)-N-phenylamino]biphenyl BSPB), 4-phenyl-4'-(9-phenylfluoren-9-yl)triphenylamine (abbreviation: (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi [9H-fluoren]-2-amine (abbreviation: PCBASF); compounds having a carbazole skeleton such as 1,3-bis(N-carbazolyl) benzene (abbreviation: mCP), 4,4'-di(N-carbazolyl)biphenyl (abbreviation: CBP), 3,6-bis(3,5-diphenylphenyl)-9-phenyl-carbazole (abbreviation: CzTP), and 3,3'-bis(9-phenyl-9H-carbazole) (abbreviation: PCCP); compounds having a thiophene skeleton such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl] dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferred because these compounds are highly reliable and have high hole-transport properties to contribute to a reduction in driving voltage. In addition, the organic compounds given as examples of the above second organic compound can also be used.

As the material having an electron-transport property, metal complexes such as bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc (II) (abbreviation: ZnBTZ); or an organic compound having a π-electron deficient heteroaromatic ring skeleton is preferable. Examples of the organic compound having a π-electron deficient heteroaromatic ring skeleton include 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBT-BIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2-Pm-II); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton and the heterocyclic compound having a pyridine skeleton have high reliability and thus are preferable. In particular, the heterocyclic compound having a diazine (pyrimidine or pyrazine) skeleton has an excellent electron-transport property to contribute to a reduction in driving voltage.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the emission center substance, whereby the emission efficiency of the light-emitting device can be increased. Here, the TADF material functions as an energy donor, and the emission center substance functions as an energy acceptor.

This is very effective in the case where the emission center substance is a fluorescent substance. In that case, it is preferable that the S1 level of the TADF material be higher than the S1 level of the fluorescent substance in order that high emission efficiency be achieved. Furthermore, the T1 level of the TADF material is preferably higher than the S1 level of the fluorescent substance. Therefore, the T1 level of the TADF material is preferably higher than the T1 level of the fluorescent substance.

A TADF material that emits light whose wavelength overlaps with the wavelength on a lowest-energy-side absorption band of the fluorescent substance is preferably used, in which case excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the emission center substance, a material having an anthracene skeleton is favorably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), and 9-(1-naphthyl)-10-[4-(2-naphthyl)phenyl]anthracene (abbreviation: αN-βNPAnth). Note that CzPA, cgDBCzPA, 2mBnfPPA, and PCzPA have excellent characteristics and thus are preferably selected.

Note that the host material (the fifth organic compound) may be a mixture of a plurality of kinds of substances; in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The weight ratio of the content of the material having a hole-transport property to the content of the material having an electron-transport property may be 1:19 to 19:1. In the case of using the mixed host material as the fifth organic compound, the HOMO level of the fifth organic compound is regarded as a HOMO level of the material having a hole-transport property.

Note that a phosphorescent substance can be used as part of the mixed material. When a fluorescent substance is used as the emission center substance, a phosphorescent substance can be used as an energy donor for supplying excitation energy to the fluorescent substance.

An exciplex may be formed of these mixed materials. When these mixed materials are selected so as to form an exciplex that exhibits light emission whose wavelength overlaps with the wavelength on a lowest-energy-side absorption band of the light-emitting material, energy can be transferred smoothly and light emission can be obtained efficiently. The use of such a structure is preferred because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the LUMO level of the material having a hole-transport property is preferably higher than or equal to the LUMO level of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient PL lifetime of the mixed film has more long lifetime components or has a larger proportion of delayed components than that of each of the materials, observed by comparison of transient photoluminescence (PL) of the material having a hole-transport property, the material having an electron-transport property, and the mixed film of the materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of the materials.

The light-emitting device of one embodiment of the present invention having the above-described structure can have a long lifetime.

Embodiment 2

Next, examples of specific structures and materials of the aforementioned light-emitting device will be described. As described above, the light-emitting device of one embodiment of the present invention includes the EL layer 103 that is positioned between the pair of electrodes (the anode 101 and the cathode 102) and has a plurality of layers. In the EL layer 103, the hole-injection layer 111, the first hole-transport layer 112-1, the second hole-transport layer 112-2, the light-emitting layer 113, and the electron-transport layer are provided from the anode 101 side.

There is no particular limitation on the other layers included in the EL layer 103, and various layers such as a hole-injection layer, a hole-transport layer, an electron-transport layer, an electron-injection layer, a carrier-blocking layer, an exciton-blocking layer, and a charge generation layer can be employed.

The anode 101 is preferably formed using any of metals, alloys, conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that although the typical materials for forming the anode are listed above, a composite material of an organic compound having a hole-transport property and a substance exhibiting an electron-accepting property with respect to the organic compound is used for the hole-injection layer 111 of one embodiment of the present invention; thus, an electrode material can be selected regardless of its work function.

Two kinds of stacked layer structure of the EL layer 103 are described: a structure illustrated in FIGS. 1A1 and 1A2, which includes the electron-injection layer 115 in addition to the hole-injection layer 111, the hole-transport layer 112 (the first hole-transport layer 112-1 and the second hole-transport layer 112-2), the light-emitting layer 113, and the electron-transport layer 114; and a structure illustrated in FIG. 1B, which includes a charge generation layer 116 in addition to the hole-injection layer 111, the first hole-transport layer 112-1, the second hole-transport layer 112-2, the light-emitting layer 113, and the electron-transport layer 114. Materials for forming each layer will be specifically described below.

Since the hole-injection layer 111, the hole-transport layer 112 (the first hole-transport layer 112-1 and the second hole-transport layer 112-2), and the light-emitting layer 113 are described in detail in Embodiment 1, the description thereof is not repeated. Refer to the description in Embodiment 1.

The electron-transport layer 114 is provided between the light-emitting layer 113 and the cathode 102. The electron-transport layer 114 contains an organic compound having an electron-transport property. As the organic compound having an electron-transport property, any of the above-mentioned electron-transport organic compounds that can be used as the host material, and the above-mentioned organic compounds that can be used as the host material for the fluorescent substance can be used. It is preferable to use an organic compound whose electron mobility in the case where the square root of the electric field strength [V/cm] is 600 is higher than or equal to $1 \times 10^{-7}$ cm$^2$/Vs and lower than or equal to $5 \times 10^{-5}$ cm$^2$/Vs.

A layer containing an alkali metal, an alkaline earth metal, or a compound thereof such as lithium fluoride (LiF), cesium fluoride (CsF), or calcium fluoride (CaF$_2$) may be provided as the electron-injection layer 115 between the electron-transport layer 114 and the cathode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to calcium oxide-aluminum oxide.

Instead of the electron-injection layer 115, the charge generation layer 116 may be provided between the electron-transport layer 114 and the cathode 102 (FIG. 1B). The charge generation layer 116 refers to a layer capable of injecting holes into a layer in contact with the cathode side of the charge generation layer 116 and electrons into a layer in contact with the anode side thereof when a potential is applied. The charge generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode 102 serving as a cathode; thus, the light-emitting device operates.

Note that the charge generation layer 116 preferably includes an electron-relay layer 118 and/or an electron-injection buffer layer 119 in addition to the p-type layer 117.

The electron-relay layer 118 includes at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the electron-accepting substance in the p-type layer 117 and the LUMO level of a substance contained in a layer of the electron-transport layer 114 that is in contact with the charge generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having an excellent electron-injection property can be used for the electron-injection buffer layer 119. For example, an alkali metal, an alkaline earth metal, a rare earth metal, or a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used.

In the case where the electron-injection buffer layer 119 includes the substance having an electron-transport property and a substance having an electron-donating property, an organic tetrathianaphthacene (abbreviation: TTN), nickelocene, or compound such as decamethylnickelocene can be used as the substance having an electron-donating property, as well as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the cathode 102, a metal, an alloy, an electrically conductive compound, or a mixture thereof each having a low work function (specifically, lower than or equal to 3.8 eV) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode 102 and the electron-transport layer, for the cathode 102, a variety of conductive materials such as Al, Ag, ITO, or indium oxide-tin oxide containing silicon or silicon oxide can be used regardless of the work function. Films of these conductive materials can be formed by a dry process such as a vacuum evaporation method or a sputtering method, an inkjet method, a spin coating method, or the like. Alternatively, a wet process using a sol-gel method or a wet process using a paste of a metal material may be employed.

Furthermore, any of a variety of methods can be used for forming the EL layer 103, regardless of a dry method or a wet method. For example, a vacuum evaporation method, a gravure printing method, an offset printing method, a screen printing method, an inkjet method, a spin coating method, or the like may be used.

Different methods may be used to form the electrodes or the layers described above.

The structure of the layers provided between the anode 101 and the cathode 102 is not limited to the above-described structure. Preferably, a light-emitting region where holes and electrons recombine is positioned away from the anode 101 and the cathode 102 so as to prevent quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material included in the light-emitting layer.

Next, an embodiment of a light-emitting device with a structure in which a plurality of light-emitting units are stacked (this type of light-emitting device is also referred to as a stacked or tandem light-emitting device) is described with reference to FIG. 1C. This light-emitting device includes a plurality of light-emitting units between an anode and a cathode. One light-emitting unit has substantially the same structure as the EL layer 103 illustrated in FIG. 1A1 or 1A2. In other words, the light-emitting device illustrated in FIG. 1A1, 1A2, or 1B includes a single light-emitting unit, and the light-emitting device illustrated in FIG. 1C includes a plurality of light-emitting units.

In FIG. 1C, a first light-emitting unit 511 and a second light-emitting unit 512 are stacked between an anode 501 and a cathode 502, and a charge generation layer 513 is provided between the first light-emitting unit 511 and the second light-emitting unit 512. The anode 501 and the cathode 502 correspond, respectively, to the anode 101 and the cathode 102 illustrated in FIGS. 1A1 and 1A2, and the materials given in the description for FIGS. 1A1 and 1A2 can be used. Furthermore, the first light-emitting unit 511 and the second light-emitting unit 512 may have the same structure or different structures.

The charge generation layer 513 has a function of injecting electrons into one of the light-emitting units and injecting holes into the other of the light-emitting units when a voltage is applied between the anode 501 and the cathode 502. That is, in FIG. 1C, the charge generation layer 513 injects electrons into the first light-emitting unit 511 and holes into the second light-emitting unit 512 when a voltage is applied so that the potential of the anode becomes higher than the potential of the cathode.

The charge generation layer 513 preferably has a structure similar to that of the charge generation layer 116 described with reference to FIG. 1B. A composite material of an organic compound and a metal oxide has an excellent carrier-injection property and an excellent carrier-transport property; thus, low-voltage driving and low-current driving can be achieved. In the case where the anode-side surface of a light-emitting unit is in contact with the charge generation layer 513, the charge generation layer 513 can also function as a hole-injection layer of the light-emitting unit; therefore, a hole-injection layer is not necessarily provided in the light-emitting unit.

In the case where the charge generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side.

The light-emitting device having two light-emitting units is described with reference to FIG. 1C; however, one embodiment of the present invention can also be applied to a light-emitting device in which three or more light-emitting units are stacked. With a plurality of light-emitting units partitioned by the charge generation layer 513 between a pair of electrodes as in the light-emitting device of this embodiment, it is possible to provide a long-life element which can emit light with high luminance at a low current density. A light-emitting apparatus which can be driven at a low voltage and has low power consumption can be provided.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as the whole. The light-emitting device in which three or more light-emitting units are stacked can be, for example, a tandem device in which a first light-emitting unit includes a first blue light-emitting layer, a second light-emitting unit includes a yellow or yellow-green light-emitting layer and a red light-emitting layer, and a third light-emitting unit includes a second blue light-emitting layer. The tandem device can provide white light emission like the above light-emitting device.

The above-described layers and electrodes such as the EL layer 103, the first light-emitting unit 511, the second light-emitting unit 512, and the charge generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Embodiment 3

In this embodiment, a light-emitting apparatus including the light-emitting device described in Embodiments 1 and 2 will be described.

In this embodiment, the light-emitting apparatus manufactured using the light-emitting device described in Embodiments 1 and 2 is described with reference to FIGS. 2A and 2B. Note that FIG. 2A is a top view of the light-emitting apparatus and FIG. 2B is a cross-sectional view taken along the lines A-B and C-D in FIG. 2A. This light-emitting apparatus includes a driver circuit portion (source line driver circuit) 601, a pixel portion 602, and a driver circuit portion (gate line driver circuit) 603, which are to control the light emission of a light-emitting device and illustrated with dotted lines. A reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in the present specification includes, in its category, not only the light-emitting apparatus itself but also the light-emitting apparatus provided with the FPC or the PWB.

Next, a cross-sectional structure is described with reference to FIG. 2B. The driver circuit portions and the pixel portion are formed over an element substrate 610. Here, the source line driver circuit 601, which is a driver circuit portion, and one pixel in the pixel portion 602 are illustrated.

The element substrate 610 may be a substrate containing glass, quartz, an organic resin, a metal, an alloy, or a semiconductor or a plastic substrate formed of fiber reinforced plastic (FRP), polyvinyl fluoride (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case degradation of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably includes at least indium (In) or zinc (Zn). Further preferably, the oxide semiconductor includes an oxide represented by an In-M-Zn-based oxide (M represents a metal such as Al, Ti, Ga, Ge, Y, Zr, Sn, La, Ce, or Hf).

An oxide semiconductor that can be used in one embodiment of the present invention is described below.

An oxide semiconductor (metal oxide) is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that it is difficult to observe a clear grain boundary even in the vicinity of distortion in the CAAC-OS. That is, a lattice arrangement is distorted and thus formation of a grain boundary is inhibited. This is because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter an In layer) and a layer containing the element M, zinc, and oxygen (hereinafter an (M, Zn) layer) are stacked. Note that indium and the element M can be replaced with each other, and when the element M of the (M, Zn) layer is replaced with indium, the layer can be referred to as an (In, M, Zn) layer. When indium of the In layer is replaced with the element M, the layer can be referred to as an (In, M) layer.

The CAAC-OS is an oxide semiconductor with high crystallinity. By contrast, in the CAAC-OS, a reduction in electron mobility due to a grain boundary is less likely to occur because it is difficult to observe a clear grain boundary. Entry of impurities, formation of defects, or the like might decrease the crystallinity of an oxide semiconductor. This means that the CAAC-OS is an oxide semiconductor having small amounts of impurities and defects (e.g., oxygen vacancies (also referred to as $V_O$)). Thus, an oxide semiconductor including the CAAC-OS is physically stable. Accordingly, the oxide semiconductor including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method.

Note that an indium-gallium-zinc oxide (hereinafter IGZO) that is an oxide semiconductor containing indium, gallium, and zinc has a stable structure in some cases by being formed of the above-described nanocrystals. In particular, IGZO crystals tend not to grow in the air and thus, a stable structure is obtained when IGZO is formed of smaller crystals (e.g., the above-described nanocrystals) rather than larger crystals (here, crystals with a size of several millimeters or several centimeters).

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

A cloud-aligned composite OS (CAC-OS) may be used as an oxide semiconductor other than the above.

A CAC-OS has a conducting function in part of the material and has an insulating function in another part of the material; as a whole, the CAC-OS has a function of a semiconductor. Note that in the case where the CAC-OS is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS. In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS includes components having different bandgaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS can also be referred to as a matrix composite or a metal matrix composite.

The use of the above-described oxide semiconductor materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics or the like of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside the substrate.

The pixel portion 602 includes a plurality of pixels including a switching FET 611, a current controlling FET 612, and an anode 613 electrically connected to a drain of the current controlling FET 612. One embodiment of the present invention is not limited to the structure. The pixel portion 602 may include three or more FETs and a capacitor in combination.

Note that to cover an end portion of the anode 613, an insulator 614 is formed. Here, the insulator 614 can be formed using positive photosensitive acrylic here.

In order to improve the coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a cathode 617 are formed over the anode 613. Here, as a material used for the anode 613, a material having a high work function is desirably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance and favorable ohmic contact, and can function as an anode.

The EL layer 616 is formed by any of a variety of methods such as an evaporation method using an evaporation mask, an inkjet method, and a spin coating method. The EL layer 616 has the structure described in Embodiments 1 and 2. As another material included in the EL layer 616, a low molecular compound or a high molecular compound (including an oligomer or a dendrimer) may be used.

As a material used for the cathode 617, which is formed over the EL layer 616, a material having a low work function (e.g., Al, Mg, Li, and Ca, or an alloy or a compound thereof, such as MgAg, MgIn, or AlLi) is preferably used. In the case where light generated in the EL layer 616 is transmitted through the cathode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the cathode 617.

Note that the light-emitting device is formed with the anode 613, the EL layer 616, and the cathode 617. The light-emitting device is the light-emitting device described in Embodiments 1 and 2. In the light-emitting apparatus of this embodiment, the pixel portion, which includes a plurality of light-emitting devices, may include both the light-emitting device described in Embodiments 1 and 2 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case degradation due to influence of moisture can be suppressed.

An epoxy-based resin or glass frit is preferably used for the sealing material 605. It is desirable that such a material not be permeable to moisture or oxygen as much as possible. As the sealing substrate 604, a glass substrate, a quartz substrate, or a plastic substrate formed of fiber reinforced plastic (FRP), polyvinyl fluoride (PVF), polyester, or acrylic can be used.

Although not illustrated in FIGS. 2A and 2B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on a surface with a complex uneven shape or upper, side, and lower surfaces of a touch panel.

As described above, the light-emitting apparatus manufactured using the light-emitting device described in Embodiments 1 and 2 can be obtained.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

FIGS. 3A and 3B each illustrate an example of a light-emitting apparatus in which full color display is achieved by formation of a light-emitting device exhibiting white light emission and with the use of coloring layers (color filters) and the like. FIG. 3A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of light-emitting devices, a partition 1025, an EL layer 1028, a cathode 1029 of the light-emitting devices, a sealing substrate 1031, a sealing material 1032, and the like.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
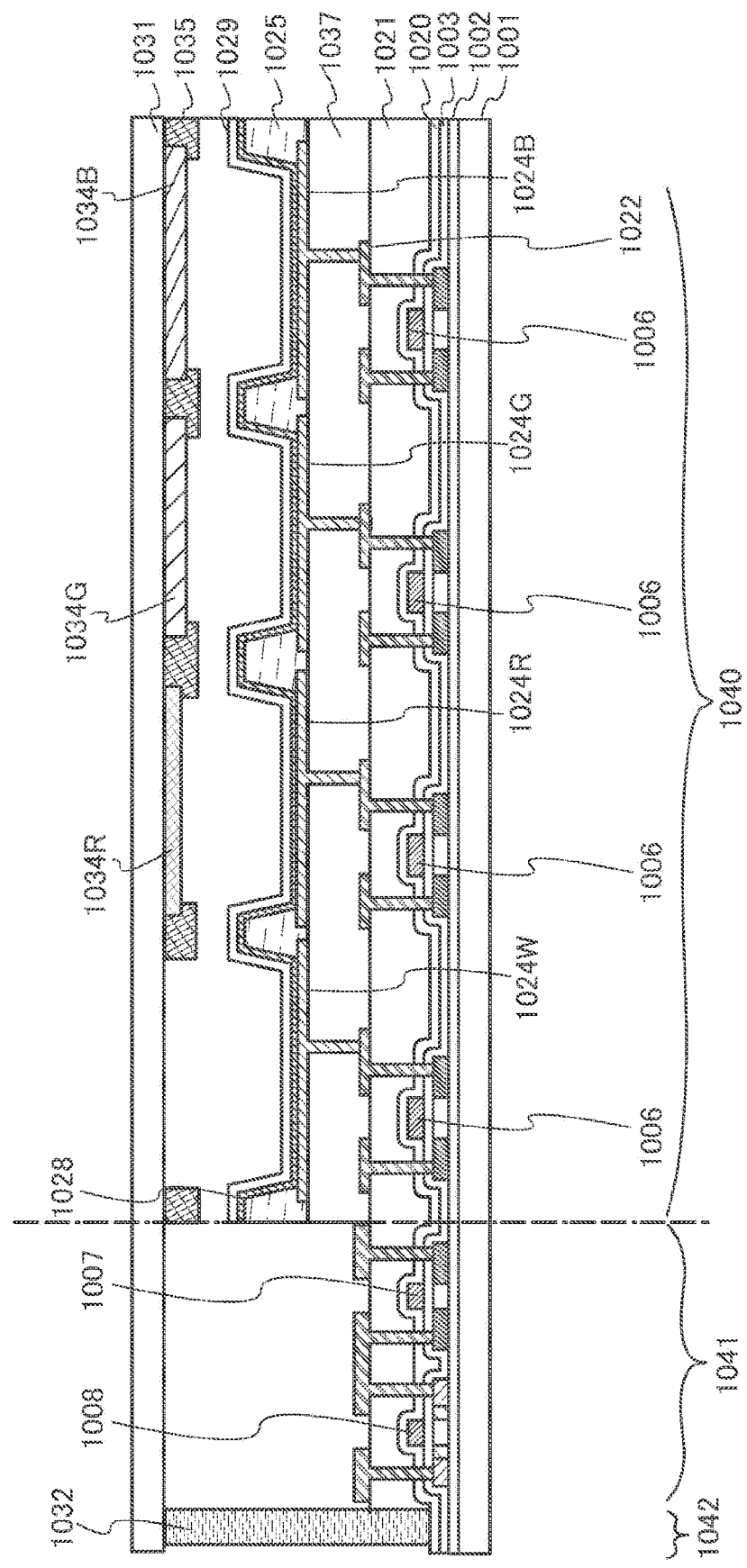
FIG. 4 is a conceptual view of an active-matrix light-emitting apparatus.

The above-described light-emitting apparatus is a light-emitting apparatus having a structure in which light is extracted from the substrate 1001 side where FETs are formed (a bottom emission structure), but may be a light-emitting apparatus having a structure in which light is extracted from the sealing substrate 1031 side (a top emission structure). FIG. 4 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The anodes 1024W, 1024R, 1024G, and 1024B of the light-emitting devices are each an anode here, but may be formed as a cathode. Furthermore, in the case of a light-emitting apparatus having a top emission structure as illustrated in FIG. 4, the anodes are preferably reflective electrodes. The EL layer 1028 is formed to have a structure similar to the structure of the EL layer 103 described in Embodiments 1 and 2, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with the use of a reflective electrode as the anode and a semi-transmissive and semi-reflective electrode as the cathode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity of 40% to 100%, preferably 70% to 100%, and a resistivity of $1 \times 10^{-2}$ Ωcm or lower. In addition, the semi-transmissive and semi-reflective electrode has a visible light reflectivity of 20% to 80%, preferably 40% to 70%, and a resistivity of $1 \times 10^{-2}$ Ωcm or lower.

Light emitted from the light-emitting layer included in the EL layer is reflected and resonated by the reflective electrode and the semi-transmissive and semi-reflective electrode.

In the light-emitting device, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus which displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured using the light-emitting device described in Embodiments 1 and 2 and thus can have favorable characteristics. Specifically, since the light-emitting device described in Embodiments 1 and 2 has a long lifetime, the light-emitting apparatus can have high reliability. Since the light-emitting apparatus using the light-emitting device described in Embodiments 1 and 2 has high emission efficiency, the light-emitting apparatus can achieve low power consumption.

Figure 5A:
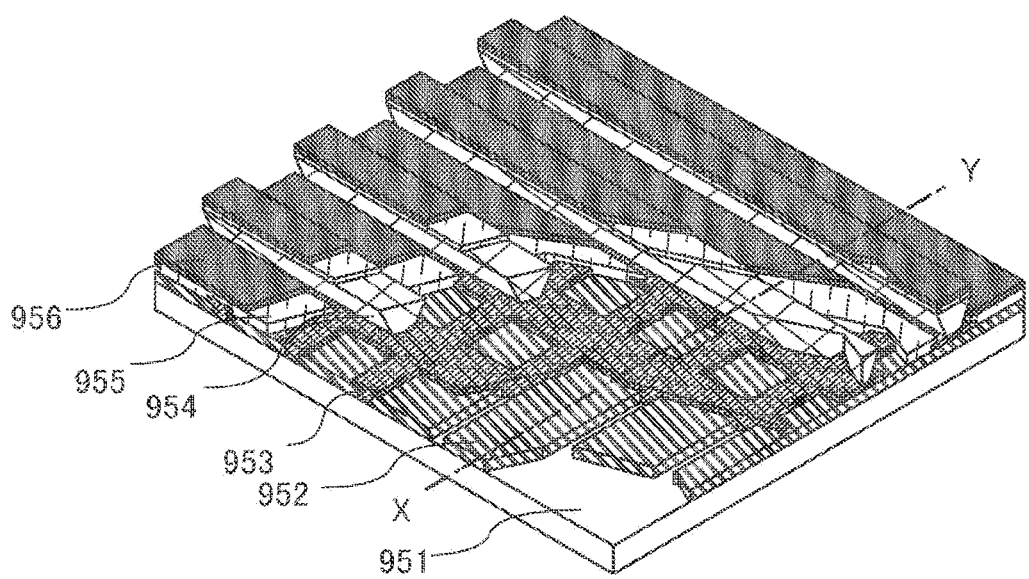
FIGS. 5A and 5B are conceptual views of a passive-matrix light-emitting apparatus.
Figure 5B:
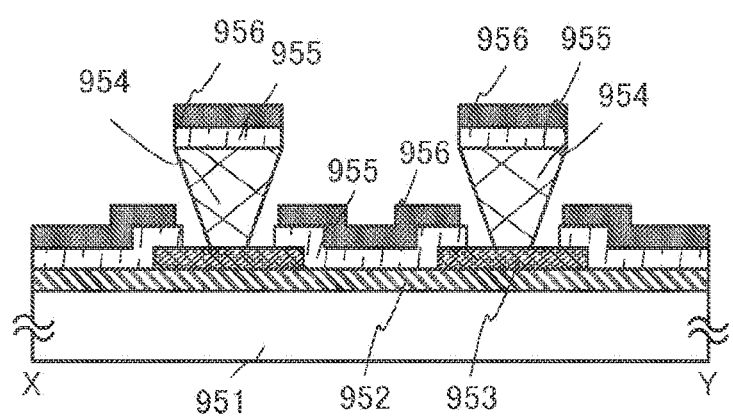

The active matrix light-emitting apparatus is described above, whereas a passive matrix light-emitting apparatus is described below. FIGS. 5A and 5B illustrate a passive matrix light-emitting apparatus manufactured using the present invention. Note that FIG. 5A is a perspective view of the light-emitting apparatus, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid that is parallel to the surface of the insulating layer 953 and is in contact with the insulating layer 953) is shorter than the upper side (a side of the trapezoid that is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in Embodiments 1 and 2; thus, the light-emitting apparatus can have high reliability or low power consumption.

Since many minute light-emitting devices arranged in a matrix in the light-emitting apparatus described above can each be controlled, the light-emitting apparatus can be suitably used as a display device for displaying images.

This embodiment can be freely combined with any of the other embodiments.

Embodiment 4

Figure 6A:
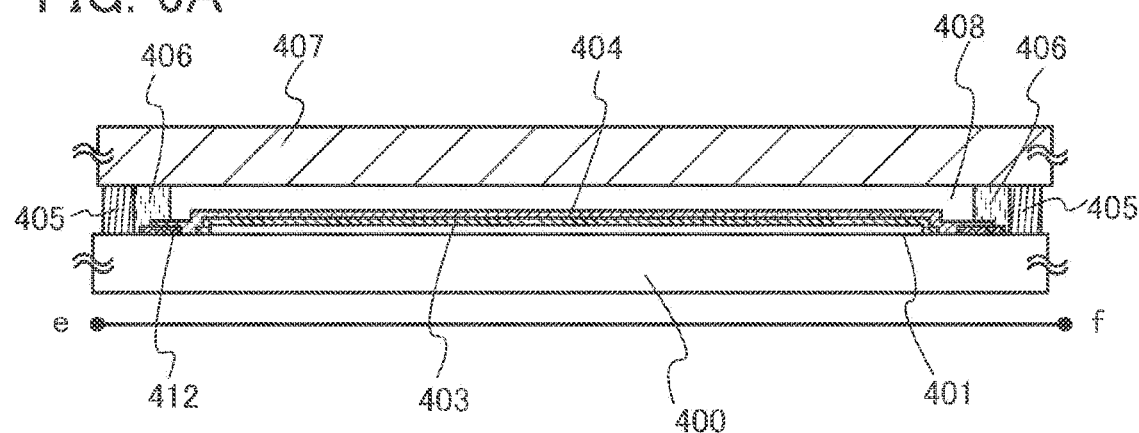
FIGS. 6A and 6B illustrate a lighting device.
Figure 6B:
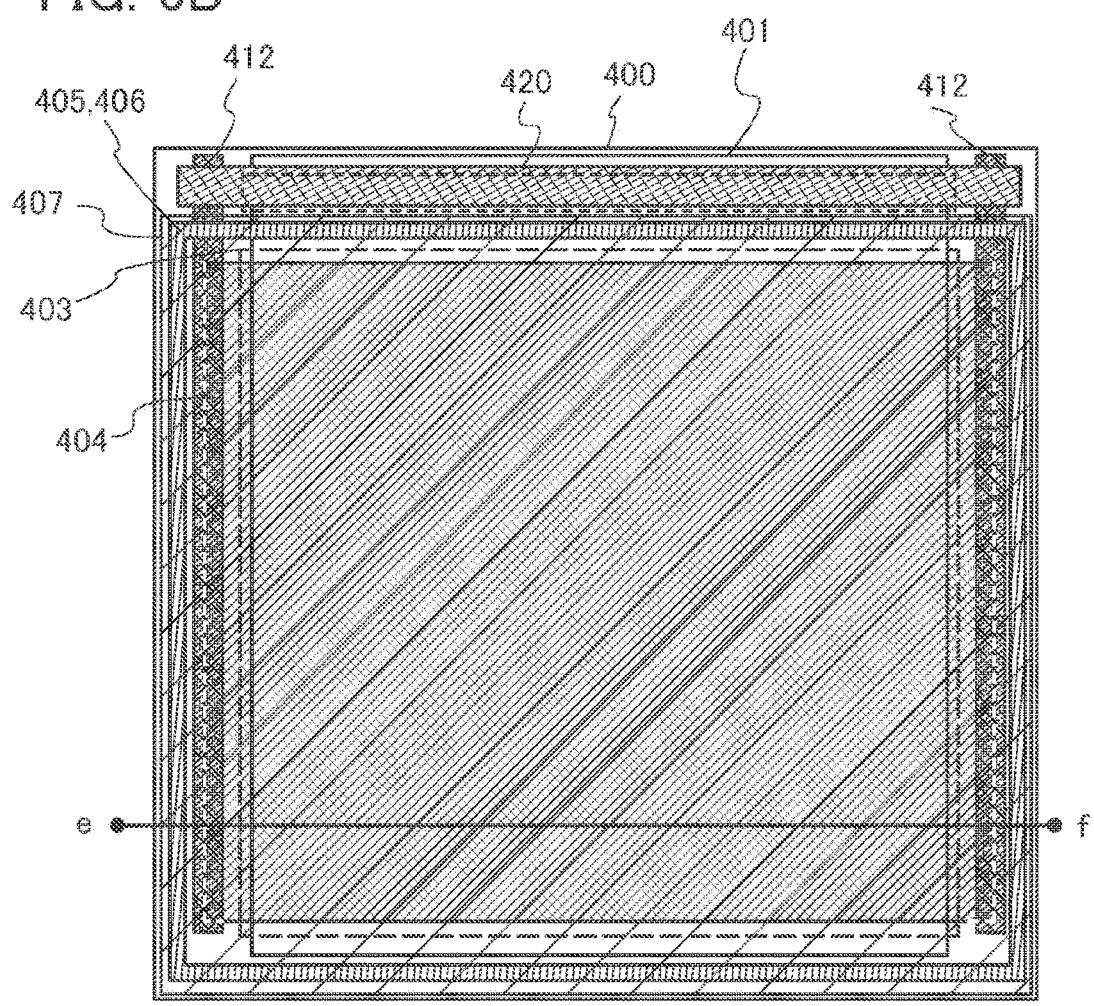

In this embodiment, an example in which the light-emitting device described in Embodiments 1 and 2 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, an anode 401 is formed over a substrate 400 which is a support and has a light-transmitting property. The anode 401 corresponds to the anode 101 in Embodiment 2. When light is extracted through the anode 401 side, the anode 401 is formed using a material having a light-transmitting property.

A pad 412 for applying voltage to a cathode 404 is formed over the substrate 400.

An EL layer 403 is formed over the anode 401. The structure of the EL layer 403 corresponds to, for example, the structure of the EL layer 103 in Embodiments 1 and 2, or the structure in which the light-emitting units 511 and 512 and the charge generation layer 513 are combined. Refer to the descriptions for the structure.

The cathode 404 is formed to cover the EL layer 403. The cathode 404 corresponds to the cathode 102 in Embodiment 2. The cathode 404 is formed using a material having high reflectance when light is extracted through the anode 401 side. The cathode 404 is connected to the pad 412, whereby voltage is applied.

As described above, the lighting device described in this embodiment includes a light-emitting device including the anode 401, the EL layer 403, and the cathode 404. Since the light-emitting device is a light-emitting device with high emission efficiency, the lighting device in this embodiment can be a lighting device having low power consumption.

The substrate 400 provided with a light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the anode 401 are extended to the outside of the sealing materials 405 and 406, the extended parts can function as external input terminals. An IC chip 420 mounted with a converter or the like may be provided over the external input terminals.

The lighting device described in this embodiment includes as an EL element the light-emitting device described in Embodiments 1 and 2; thus, the light-emitting apparatus can have high reliability at high temperature. In addition, the light-emitting apparatus can consume less power.

Embodiment 5

In this embodiment, examples of electronic devices each including the light-emitting device described in Embodiments 1 and 2 will be described. The light-emitting device described in Embodiments 1 and 2 has a long lifetime and high reliability at high temperature. As a result, the electronic devices described in this embodiment can each include a light-emitting portion having high reliability at high temperature.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in Embodiments 1 and 2 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured using the light-emitting devices described in Embodiments 1 and 2 and arranged in a matrix in the display portion 7203. The computer illustrated in FIG. 7B1 may have a structure illustrated in FIG. 7B2. A computer illustrated in FIG. 7B2 is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 7C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 including the light-emitting devices described in Embodiments 1 and 2 and arranged in a matrix.

When the display portion 7402 of the portable terminal illustrated in FIG. 7C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be taken.

Note that the structure described in this embodiment can be combined with any of the structures described in Embodiments 1 to 4 as appropriate.

As described above, the application range of the light-emitting apparatus having the light-emitting device described in Embodiments 1 and 2 is wide so that this light-emitting apparatus can be applied to electronic devices in a variety of fields. By using the light-emitting device described in Embodiments 1 and 2, an electronic device with high reliability at high temperature can be obtained.

Figure 8A:
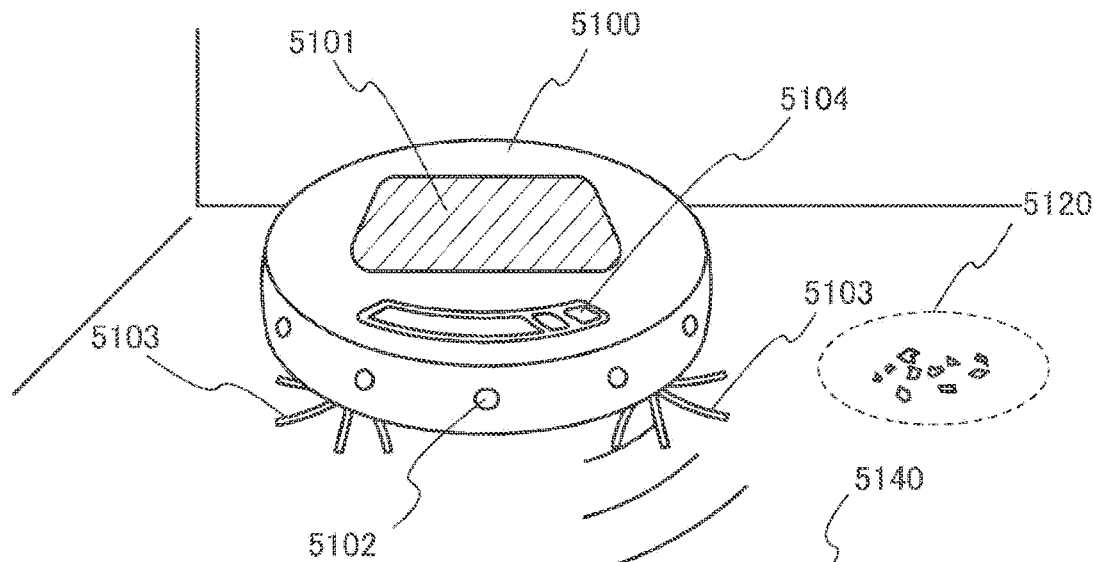
FIGS. 8A to 8C each illustrate an electronic device.

FIG. 8A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 8B:
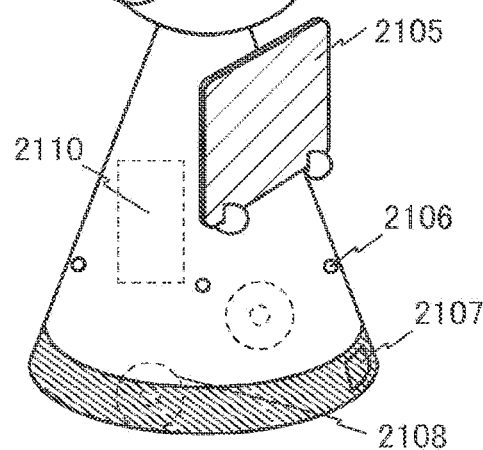

A robot 2100 illustrated in FIG. 8B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 8C:
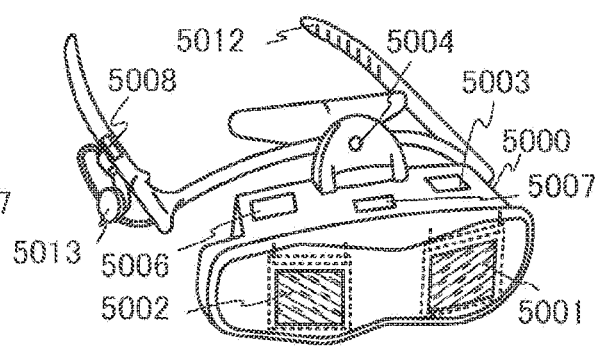

FIG. 8C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a display portion 5002, a support 5012, and an earphone 5013.

The light-emitting apparatus of one embodiment of the present invention can be used for the display portion 5001 and the display portion 5002.

Figure 9:
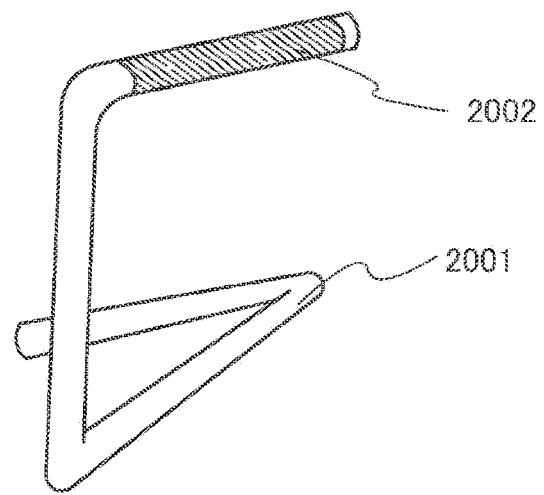
FIG. 9 illustrates a lighting device.

FIG. 9 illustrates an example in which the light-emitting device described in Embodiments 1 and 2 is used for a table lamp which is a lighting device. The table lamp illustrated in FIG. 9 includes a housing 2001 and a light source 2002, and the lighting device described in Embodiment 3 may be used for the light source 2002.

Figure 10:
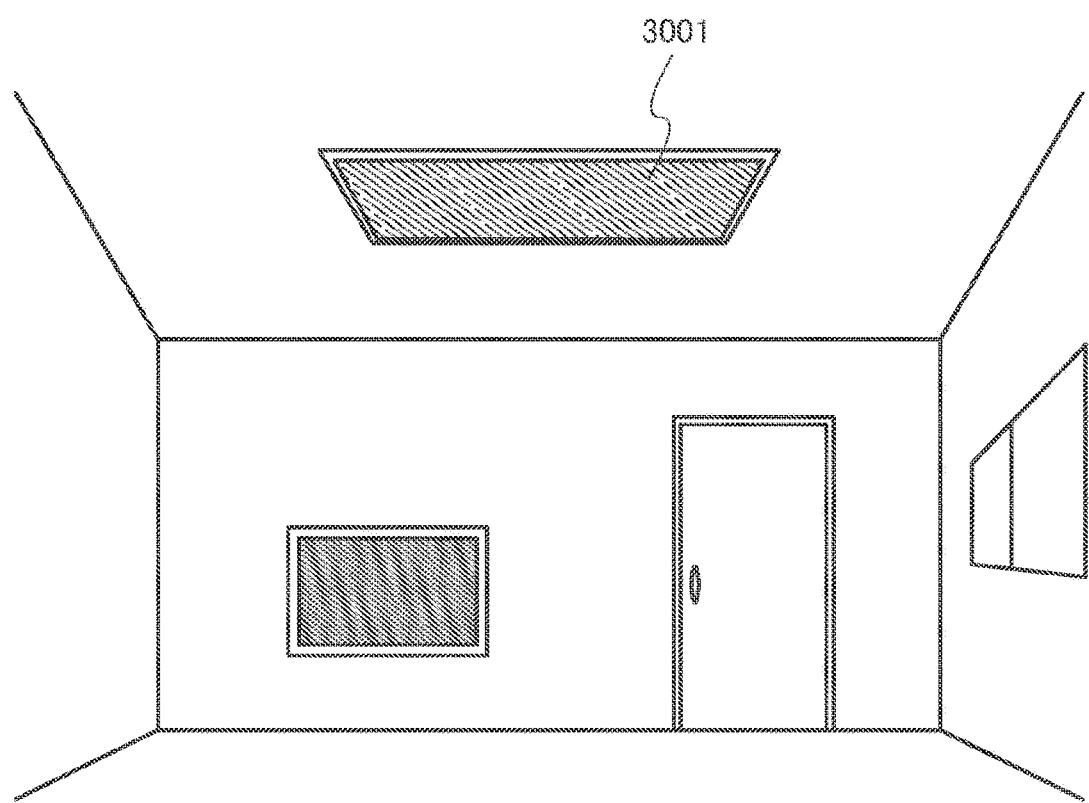
FIG. 10 illustrates a lighting device.

FIG. 10 illustrates an example in which the light-emitting device described in Embodiments 1 and 2 is used for an indoor lighting device 3001. Since the light-emitting device described in Embodiments 1 and 2 has high reliability at high temperature, the lighting device can have high reliability at high temperature. Furthermore, since the light-emitting device described in Embodiments 1 and 2 can have a large area, the light-emitting device can be used for a large-area lighting device. Furthermore, since the light-emitting device described in Embodiments 1 and 2 is thin, the light-emitting device can be used for a lighting device having a reduced thickness.

Figure 11:
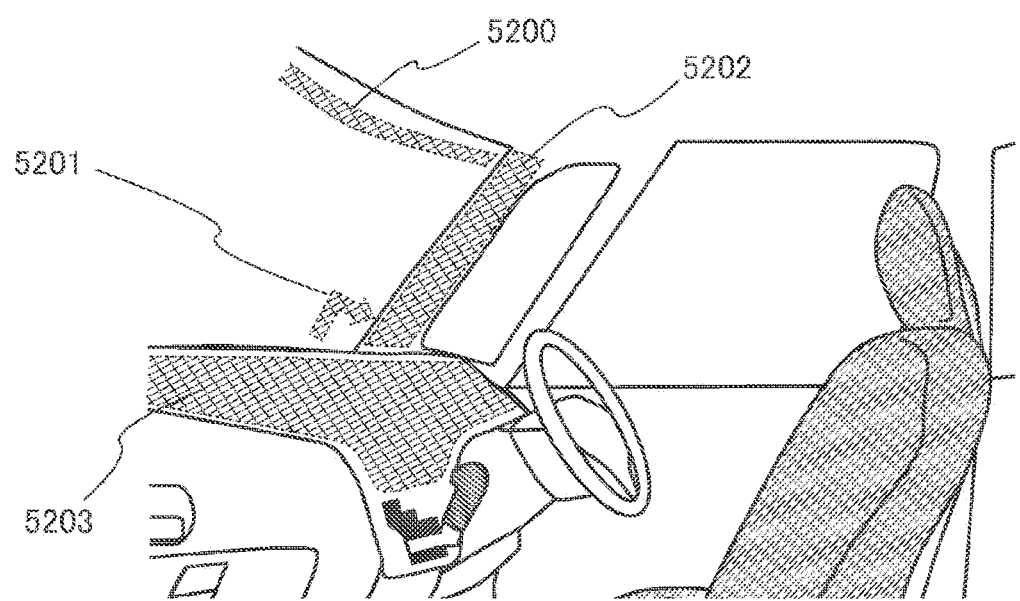
FIG. 11 illustrates in-vehicle display devices and lighting devices.

The light-emitting device described in Embodiments 1 and 2 can also be used for an automobile windshield or an automobile dashboard. FIG. 11 illustrates one mode in which the light-emitting devices described in Embodiments 1 and 2 are used for an automobile windshield and an automobile dashboard. Display regions 5200 to 5203 each include the light-emitting device described in Embodiments 1 and 2.

The display regions 5200 and 5201 are display devices which are provided in the automobile windshield and in which light-emitting devices each of which is described in Embodiments 1 and 2 are incorporated. The light-emitting devices described in Embodiments 1 and 2 can be formed into what is called a see-through light-emitting device, through which the opposite side can be seen, by including an anode and a cathode formed of electrodes having a light-transmitting property. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in Embodiments 1 and 2 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile. Thus, blind areas can be eliminated to enhance the safety. Images that compensate for the areas which a driver cannot see enable the driver to ensure safety easily and comfortably.

The display region 5203 can provide various kinds of information by displaying navigation data, a speedometer, a tachometer, and other various kinds of information. The content or layout of the display can be changed freely by a user as appropriate. Note that such information can also be displayed on the display regions 5200 to 5202. The display regions 5200 to 5203 can also be used as lighting devices.

Figure 12A:
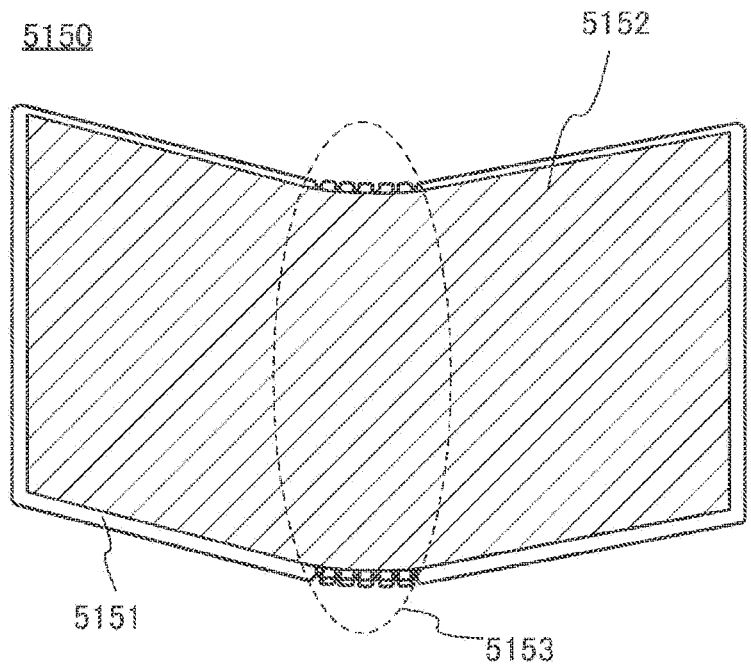
FIGS. 12A and 12B illustrate an electronic device.
Figure 12B:
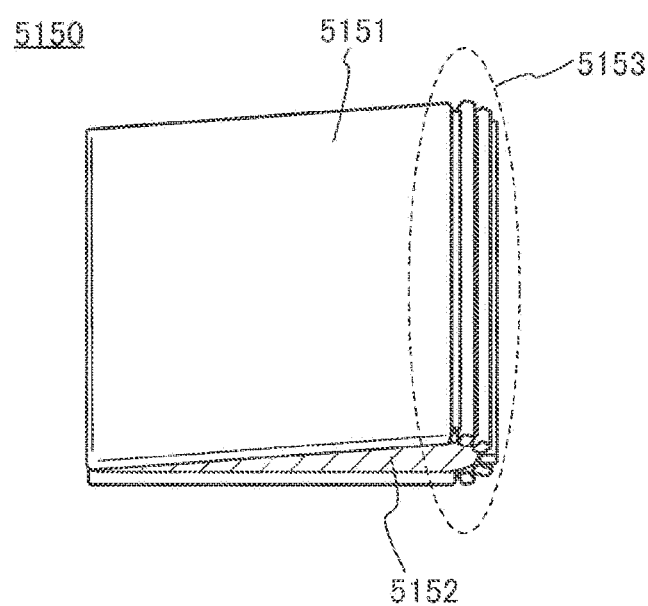

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 13A:
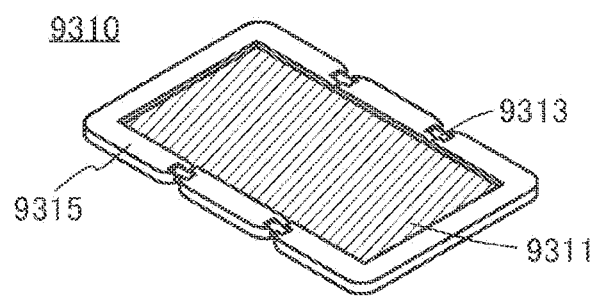
FIGS. 13A to 13C illustrate an electronic device.
Figure 13B:
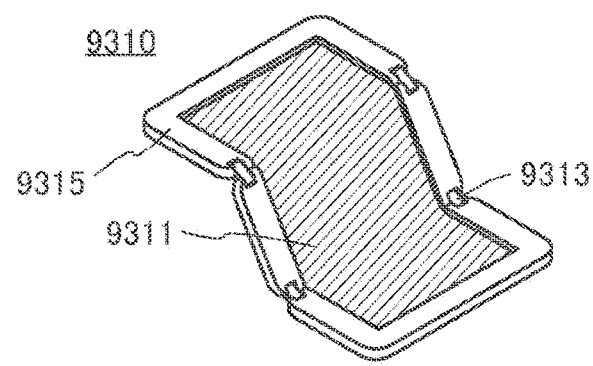
Figure 13C:
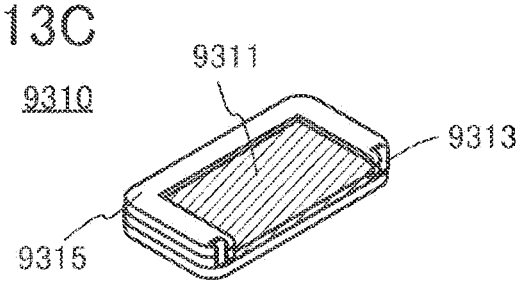

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Example 1

In this example, a light-emitting device 1 of one embodiment of the present invention and a comparative light-emitting device 1 are described. Structural formulae of organic compounds used for the light-emitting device 1 and the comparative light-emitting device 1 are shown below.

[Chemical Formula 3]

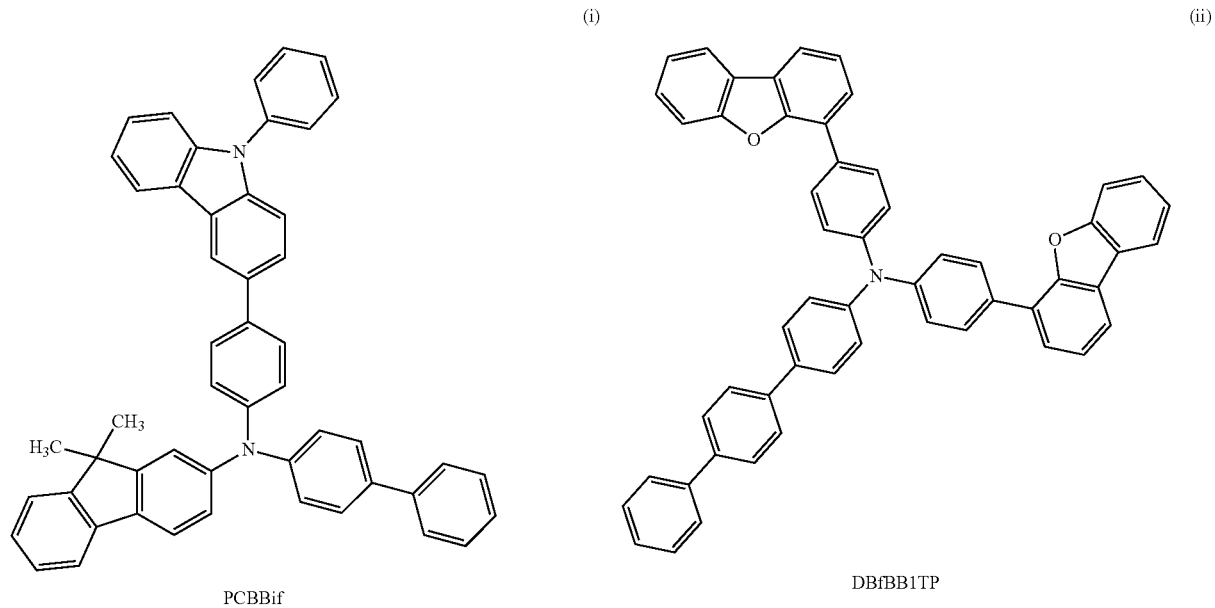

(i) PCBBif (ii) DBfBB1TP (iii)
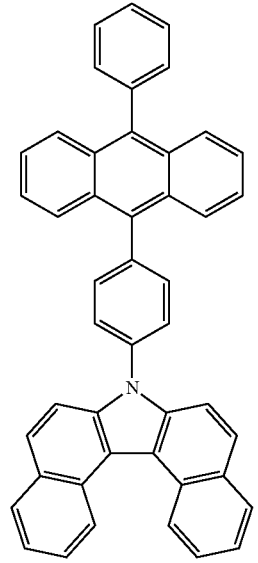
cgDBCzPA
(iv)
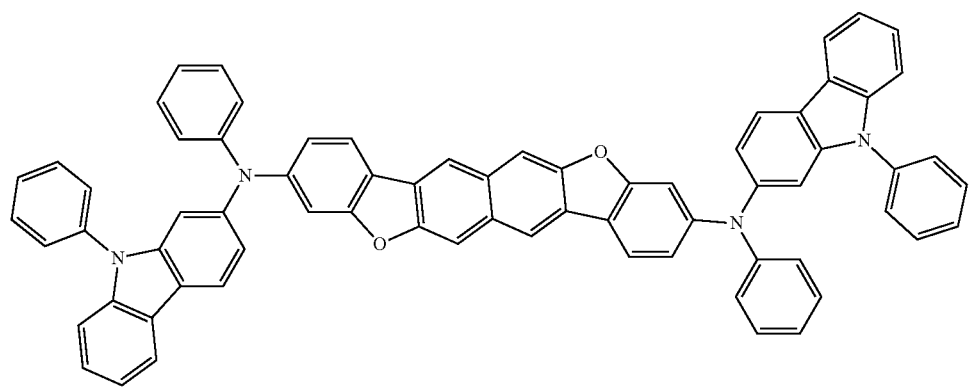
3,10PCA2Nbf(IV)-02
(v)
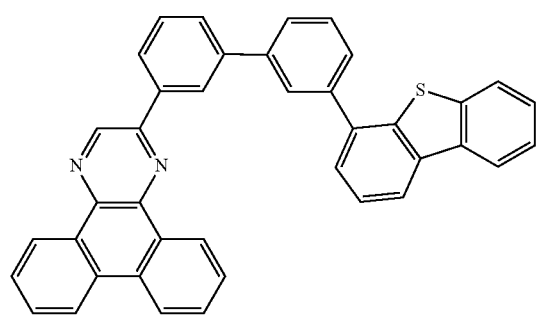
2mDBTBPDBq-II
(vi)
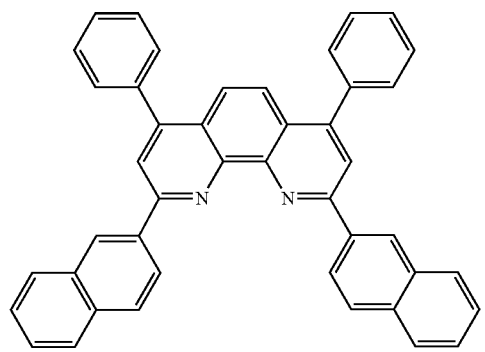
NBPhen -continued

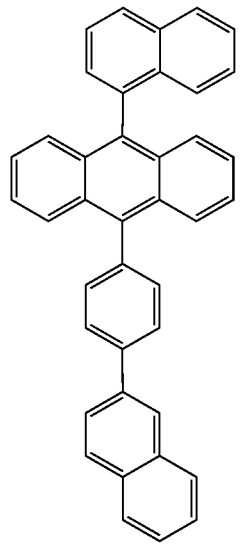

αN-βNPAnth (Method of Fabricating Light-Emitting Device 1)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the surface on which the anode 101 was formed faced downward. Then, N-(1,1'-biphenyl-4-yl)-N-[4-(9-phenyl-9H-carbazol-3-yl)phenyl]-9,9-dimethyl-9H-fluoren-2-amine (abbreviation: PCBBiF) represented by Structural Formula (i) and ALD-MP001Q (produced by Analysis Atelier Corporation, material serial No. 1S20170124) were co-evaporated to a thickness of 10 nm on the anode 101 using a resistance-heating method such that the weight ratio of PCBBIF to ALD-MP001Q was 1:0.1, whereby the hole-injection layer 111 was formed.

Subsequently, over the hole-injection layer 111, PCBBIF was evaporated to a thickness of 20 nm to form the first hole-transport layer 112-1, and then N,N-bis[4-(dibenzofuran-4-yl)phenyl]-4-amino-p-terphenyl (abbreviation: DBfBB1TP) represented by Structural Formula (ii) was evaporated to a thickness of 10 nm to form the second hole-transport layer 112-2, whereby the hole-transport layer 112 was formed. Note that the second hole-transport layer 112-2 also functions as an electron-blocking layer.

Then, 7-[4-(10-phenyl-9-anthryl)phenyl]-7H-dibenzo[c,g]carbazole (abbreviation: cgDBCzPA) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were co-evaporated to a thickness of 25 nm such that the weight ratio of cgDBCzPA to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by Structural Formula (v) was evaporated to a thickness of 15 nm, and subsequently 2,9-bis(naphthalen-2-yl)-4,7-diphenyl-1,10-phenanthroline (abbreviation: NBPhen) represented by Structural Formula (vi) was evaporated to a thickness of 10 nm, whereby the electron-transport layer 114 was formed.

After the formation of the electron-transport layer 114, lithium fluoride (LiF) was evaporated to a thickness of 1 nm to form the electron-injection layer 115. Then, aluminum was evaporated to a thickness of 200 nm to form the cathode 102. Thus, the light-emitting device 1 of this example was fabricated.

(Method of Fabricating Comparative Light-Emitting Device 1)

The comparative light-emitting device 1 was fabricated in a manner similar to that for the light-emitting device 1 except that 9-(1-naphthyl)-10-[4-(2-naphthyl)phenyl]anthracene (abbreviation: αN-βNPAnth) represented by Structural Formula (vii) was used instead of cgDBCzPA of the light-emitting device 1.

The device structures of the light-emitting device 1 and the comparative light-emitting device 1 are listed in the following table.

TABLE 1

| | Hole-injection layer | Hole-transport layer | | Light-emitting layer | Electron-transport layer | | Electron-injection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting device 1 | PCBBiF: ALD-MP001Q (1:0.1) | PCBBiF | DBfBB1TP | *1 | 2mDBTBPDBq-II | NBPhen | LiF |
| Comparative Light-emitting device 1 | | | | *2 | | | |

*1 cgDBCzPA: 3,10PCA2Nbf(IV)-02 (1:0.015)
*2 αN-βNPAnth: 3,10PCA2Nbf(IV)-02 (1:0.015)

The HOMO levels of the organic compounds used in this example are listed in the following table.

TABLE 2

| | HOMO level (eV) |
|---|---|
| PCBBiF | −5.36 |
| DBfBB1TP | −5.50 |
| cgDBCzPA | −5.69 |
| αN-βNPAnth | −5.85 |

The light-emitting device was sealed using a glass substrate in a glove box containing a nitrogen atmosphere so as not to be exposed to the air (a sealing material was applied to surround the element and UV treatment and heat treatment at 80° C. for 1 hour were performed at the time of sealing). Then, the initial characteristics and reliability of the light-emitting device were measured. Note that the measurement was performed at room temperature.

Figure 14:
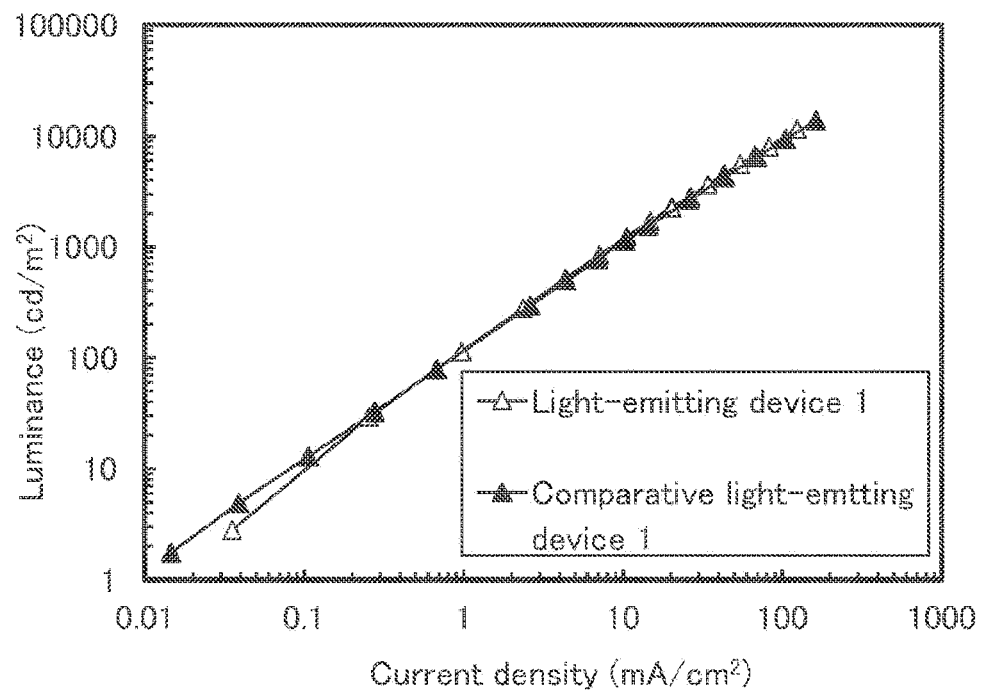
FIG. 14 shows luminance-current density characteristics of a light-emitting device 1 and a comparative light-emitting device 1.
Figure 15:
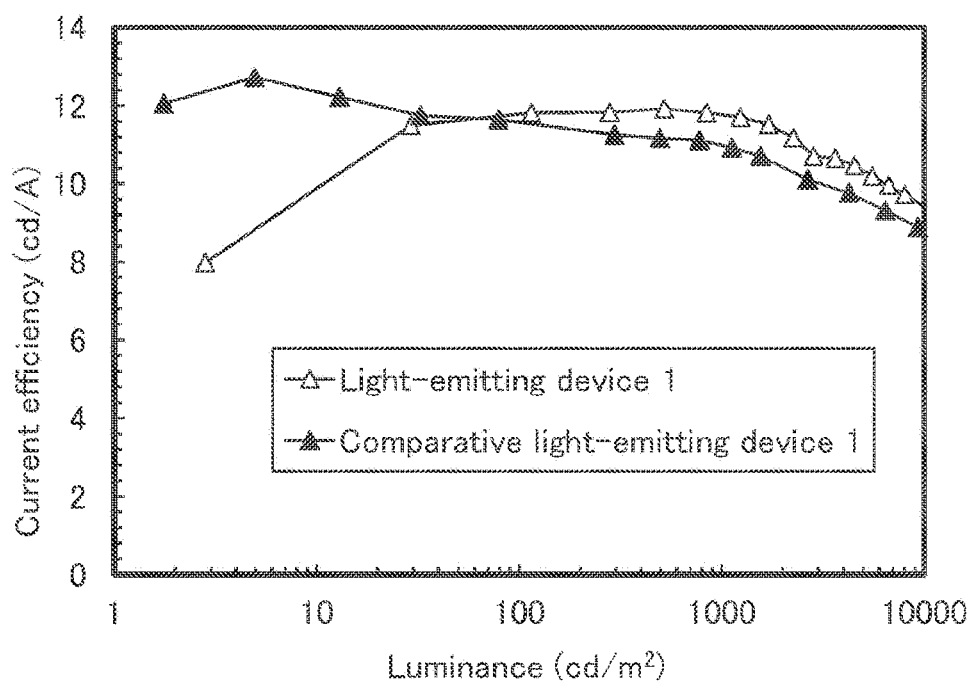
FIG. 15 shows current efficiency-luminance characteristics of the light-emitting device 1 and the comparative light-emitting device 1.
Figure 16:
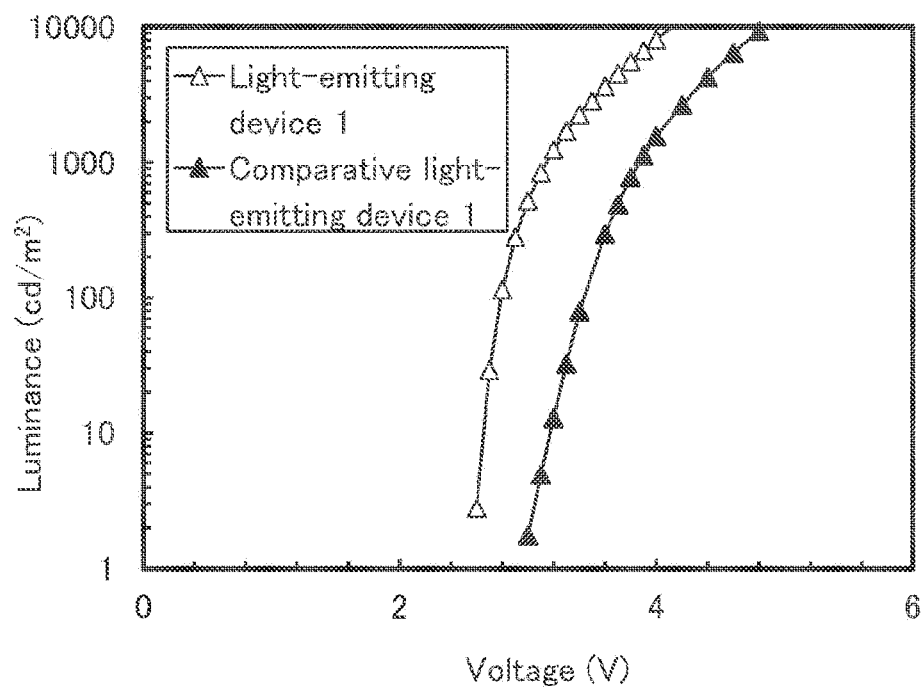
FIG. 16 shows luminance-voltage characteristics of the light-emitting device 1 and the comparative light-emitting device 1.
Figure 17:
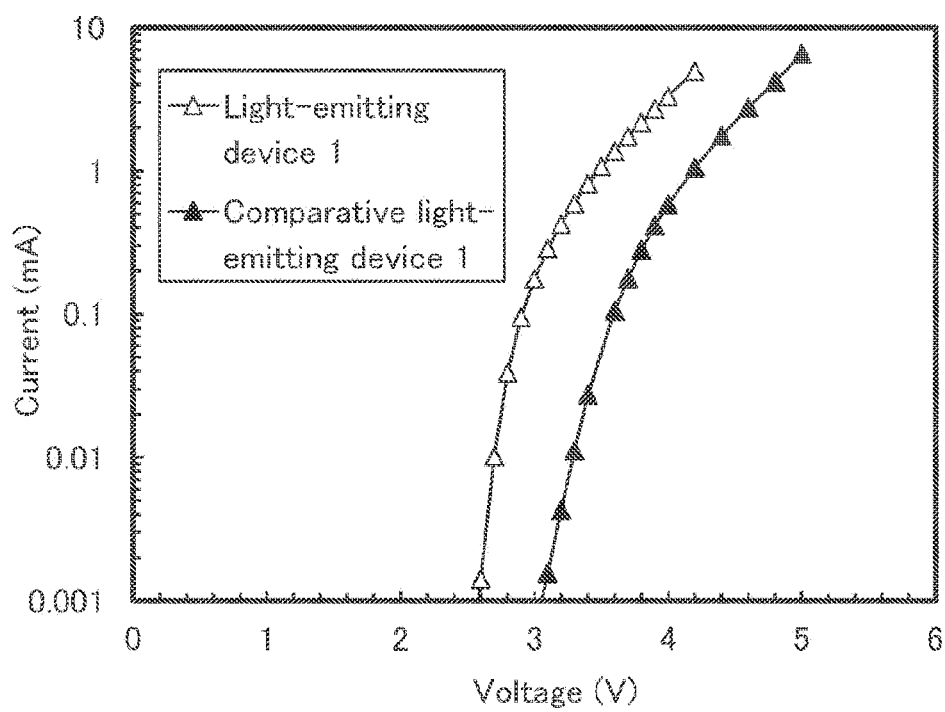
FIG. 17 shows current-voltage characteristics of the light-emitting device 1 and the comparative light-emitting device 1.
Figure 18:
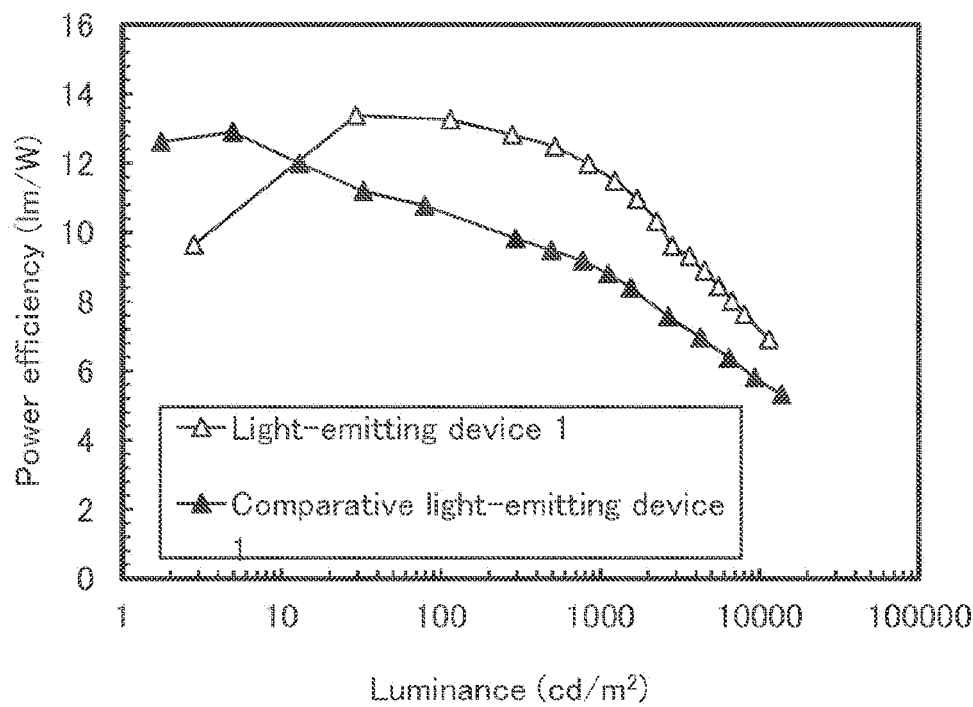
FIG. 18 shows power efficiency-luminance characteristics of the light-emitting device 1 and the comparative light-emitting device 1.
Figure 19:
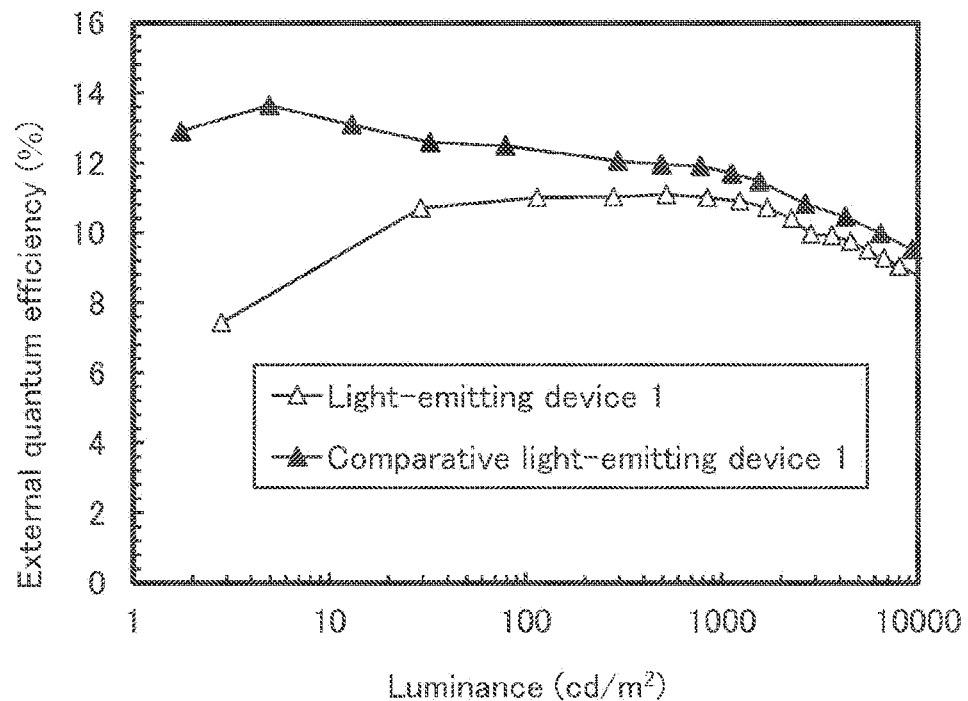
FIG. 19 shows external quantum efficiency-luminance characteristics of the light-emitting device 1 and the comparative light-emitting device 1.
Figure 20:
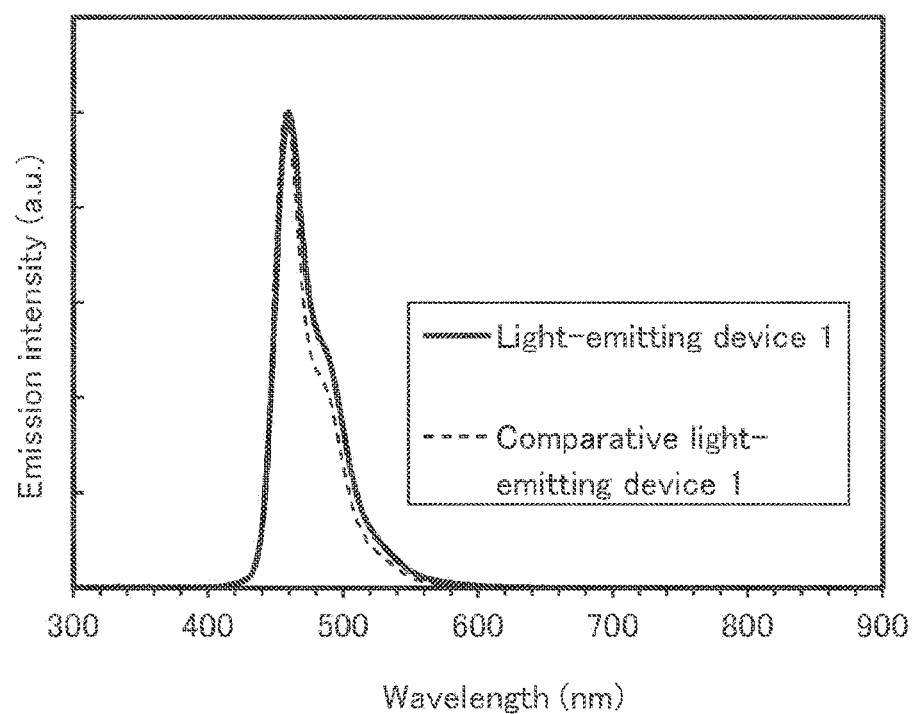
FIG. 20 shows emission spectra of the light-emitting device 1 and the comparative light-emitting device 1.

FIG. 14 shows the luminance-current density characteristics of the light-emitting device 1. FIG. 15 shows the current efficiency-luminance characteristics thereof. FIG. 16 shows the luminance-voltage characteristics thereof. FIG. 17 shows the current-voltage characteristics thereof. FIG. 18 shows the power efficiency-luminance characteristics thereof. FIG. 19 shows the external quantum efficiency-luminance characteristics thereof. FIG. 20 shows the emission spectrum thereof. Table 3 shows the main characteristics of the light-emitting device 1 at a luminance of about 1000 cd/m$^2$.

TABLE 3

| | Voltage (V) | Current (mA) | Current density (mA/cm$^2$) | Chromaticity x | Chromaticity y | Power efficiency (lm/W) | External quantum efficiency (%) |
|---|---|---|---|---|---|---|---|
| Light-emitting device 1 | 3.1 | 0.29 | 7.1 | 0.14 | 0.14 | 12.0 | 11.0 |
| Comparative Light-emitting device 1 | 3.9 | 0.41 | 10.3 | 0.14 | 0.11 | 8.8 | 11.7 |

FIG. 14 to FIG. 20 and Table 3 show that the light-emitting device 1 and the comparative light-emitting device 1 of one embodiment of the present invention are blue-light-emitting devices with favorable characteristics.

FIG. 21A is a graph showing a change in luminance over driving time at a current density of 50 mA/cm$^2$ at a high temperature of 85° C. As shown in FIG. 21A, the luminance of the light-emitting device 1 decreased substantially in accordance with the single exponential function, whereas the luminance of the comparative light-emitting device 1 decreased at high speed not in accordance with the function.

FIG. 21B is a graph showing a change in luminance over driving time at a current density of 50 mA/cm$^2$ at room temperature. At room temperature, the luminances of the light-emitting device 1 and the comparative light-emitting device 1 both decreased substantially in accordance with the single exponential function with small gradients of the degradation curves. Furthermore, the luminance of the comparative light-emitting device 1 decreased more slowly than the light-emitting device 1 at room temperature, which is opposite to the results at a high temperature of 85° C.

The host material in the light-emitting layer of the light-emitting device 1 of one embodiment of the present invention is cgDBCzPA with a HOMO level of −5.69 eV, and the material in the second hole-transport layer in contact with the light-emitting layer is DBfBB1TP with a HOMO level of −5.50 eV; thus, a difference of HOMO levels therebetween is 0.19 eV. On the other hand, the host material in the light-emitting layer of the comparative light-emitting device 1 is αN-βNPAnth with a HOMO level of −5.85 eV, and thus a difference between HOMO levels of this material and the material in the second hole-transport layer is 0.35 eV.

Here, the temperature acceleration coefficients of the light-emitting devices were compared. The temperature acceleration coefficient was calculated by dividing the elapsed time taken for the luminance to decrease to 90% of the initial luminance at room temperature (LT$_{90}$ (R.T.)) by the elapsed time taken for the luminance to decrease to 90% of the initial luminance at 85° C. (LT$_{90}$ (85 deg.)). Thus, a smaller temperature acceleration coefficient indicates smaller degradation due to high temperature during the high-temperature driving. LT$_{90}$ (R.T.) and LT$_{90}$ (85 deg.) read from in FIGS. 21A and 21B and the temperature acceleration coefficients of the light-emitting devices are listed in the following table.

TABLE 4

|  | LT90 | | Temperature acceleration coefficient |
|---|---|---|---|
|  | R.T. | 85 deg. |  |
| Light-emitting device 1 | 288 | 41 | 7 |
| Comparative light-emitting device 1 | 608 | 41 | 15 |

In the case where DBfBB1TP with a shallow HOMO level was used for the second hole-transport layer 112-2, the light-emitting device 1 using cgDBCzPA with a shallow HOMO level as a host material had a smaller temperature acceleration coefficient than the comparative light-emitting device 1 using αN-βNPAnth with a deep HOMO level as a host material, and was less affected by the high-temperature driving. This result shows that as the difference between HOMO levels of the host material and the material used for the second hole-transport layer is smaller, the degradation due to high temperature during the high-temperature driving is smaller.

In the comparative light-emitting device 1 in which the difference between HOMO levels of the host material and the hole-transport material used for the hole-transport layer in contact with the light-emitting layer was greater than 0.24 eV, the luminance largely decreased at high temperature with a change in the shape of the degradation curve, which showed a possibility of degradation in a different mechanism. On the other hand, in the light-emitting device 1 in which the difference was less than or equal to 0.24 eV, favorable results were obtained without such an irregularity. Note that the difference between HOMO levels of the host material and the hole-transport material used for the hole-transport layer that is in contact with the light-emitting layer is further preferably less than or equal to 0.20 eV.

Example 2

In this example, a light-emitting device 2 of one embodiment of the present invention and a comparative light-emitting device 2 are described. Structural formulae of organic compounds used for the light-emitting device 2 and the comparative light-emitting device 2 are shown below.

[Chemical Formula 4]

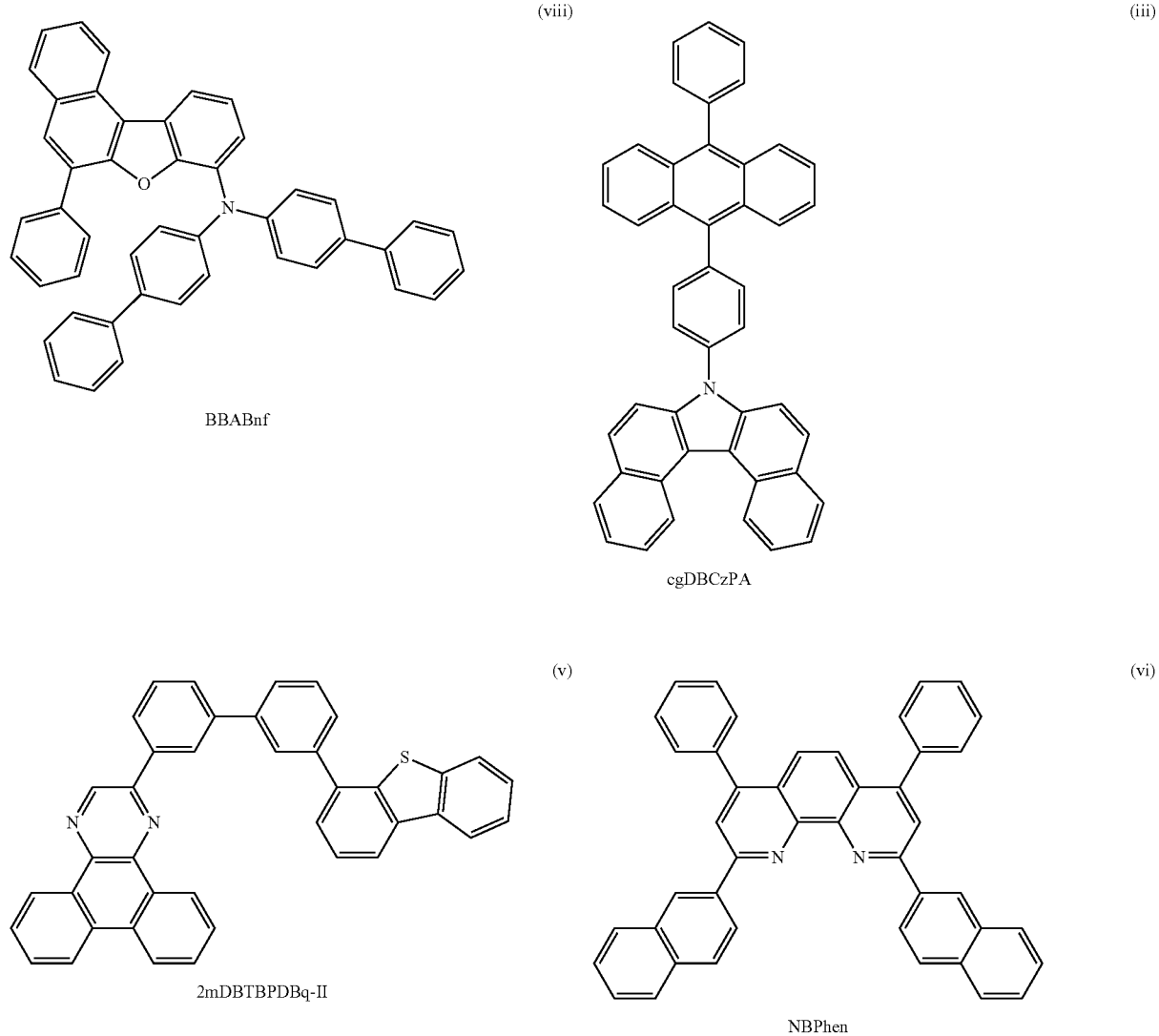

(vii)

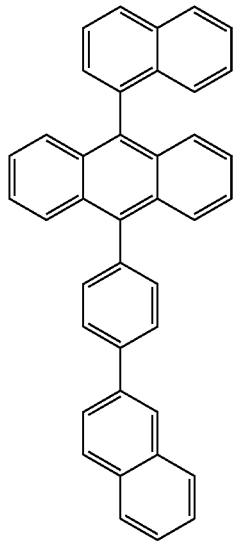

αN-βNPAnth (iv)

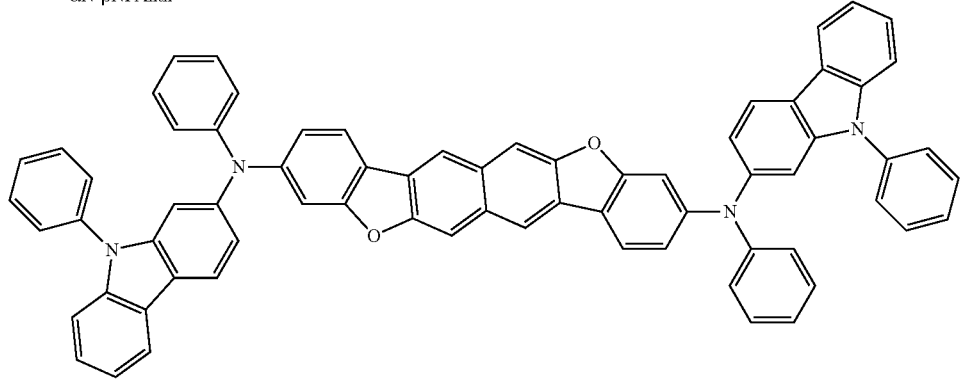

3,10PCA2Nbf(IV)-02

(Method of Fabricating Light-Emitting Device 2)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (Viii) and ALD-MP001Q (produced by Analysis Atelier Corporation, material serial No. 1S20170124) were co-evaporated to a thickness of 10 nm on the anode 101 using a resistance-heating method such that the weight ratio of BBABnf to ALD-MP001Q was 1:0.1, whereby the hole-injection layer 111 was formed.

Subsequently, over the hole-injection layer 111, BBABnf was evaporated to a thickness of 30 nm to form the hole-transport layer 112. Note that the hole-transport layer 112 also functions as an electron-blocking layer.

Then, 7-[4-(10-phenyl-9-anthryl)phenyl]-7H-dibenzo[c,g]carbazole (abbreviation: cgDBCzPA) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were co-evaporated to a thickness of 25 nm such that the weight ratio of cgDBCzPA to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by Structural Formula (v) was evaporated to a thickness of 15 nm, and subsequently 2,9-bis(naphthalen-2-yl)-4,7-diphenyl-1,10-phenanthroline (abbreviation: NBPhen) represented by Structural Formula (vi) was evaporated to a thickness of 10 nm, whereby the electron-transport layer 114 was formed.

After the formation of the electron-transport layer 114, lithium fluoride (LiF) was evaporated to a thickness of 1 nm to form the electron-injection layer 115. Then, aluminum was evaporated to a thickness of 200 nm to form the cathode 102. Thus, the light-emitting device 2 of this example was fabricated.

(Method of Fabricating Comparative Light-Emitting Device 2)

The comparative light-emitting device 2 was fabricated in a manner similar to that for the light-emitting device 2 except that 9-(1-naphthyl)-10-[4-(2-naphthyl)phenyl]anthracene (abbreviation: αN-βNPAnth) represented by Structural Formula (vii) was used instead of cgDBCzPA of the light-emitting device 2.

The device structures of the light-emitting device 2 and the comparative light-emitting device 2 are listed in the following table.

TABLE 5

| | Hole-injection layer | Hole-transport layer | Light-emitting layer | Electron-transport layer | | Electron-injecion layer |
|---|---|---|---|---|---|---|
| | 10 nm | 30 nm | 25 nm | 15 nm | 10 nm | 1 nm |
| Light-emitting device 2 | BBABnf: ALD-MP001Q (1:0.1) | BBABnf | *3 | 2mDBTBPDBq-II | NBPhen | Lif |
| Comparative Light-emitting device 2 | | | *4 | | | |

*3 cgDBCzPA: 3,10PCA2Nbf(IV)-02 (1:0.015)
*4 αN-βNPAnth: 3,10PCA2Nbf(IV)-02 (1:0.015)

The HOMO levels of the organic compounds used in this example are listed in the following table.

TABLE 6

| | HOMO level (eV) |
|---|---|
| BBABnf | −5.56 |
| cgDBCzPA | −5.69 |
| αN-βNPAnth | −5.85 |

The light-emitting device was sealed using a glass substrate in a glove box containing a nitrogen atmosphere so as not to be exposed to the air (a sealing material was applied to surround the element and UV treatment and heat treatment at 80° C. for 1 hour were performed at the time of sealing). Then, the initial characteristics and reliability of the light-emitting device were measured. Note that the measurement was performed at room temperature.

Figure 22:
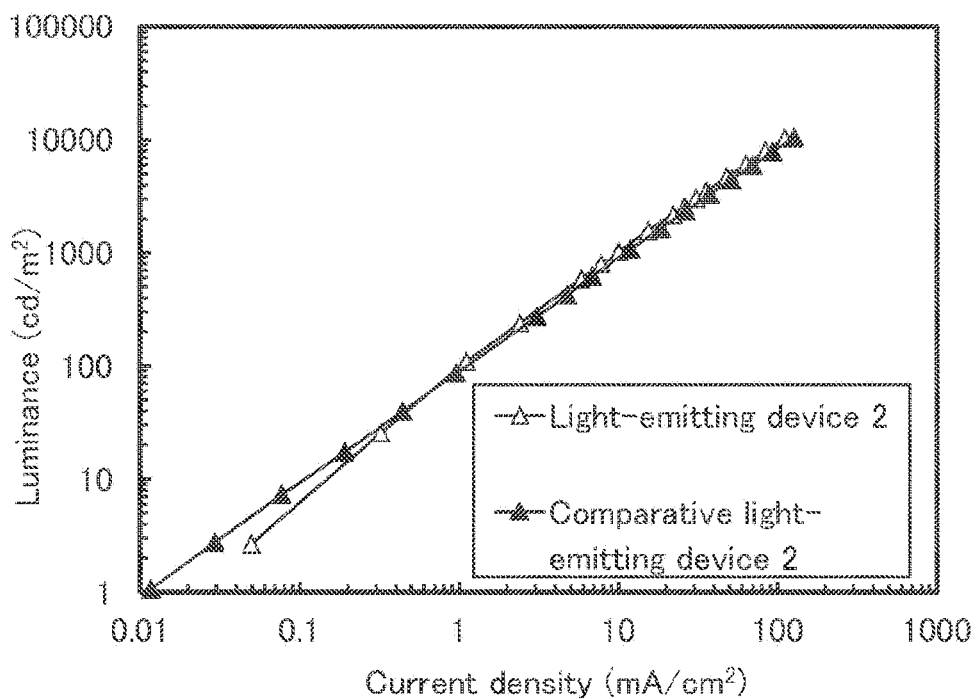
FIG. 22 shows luminance-current density characteristics of a light-emitting device 2 and a comparative light-emitting device 2.
Figure 23:
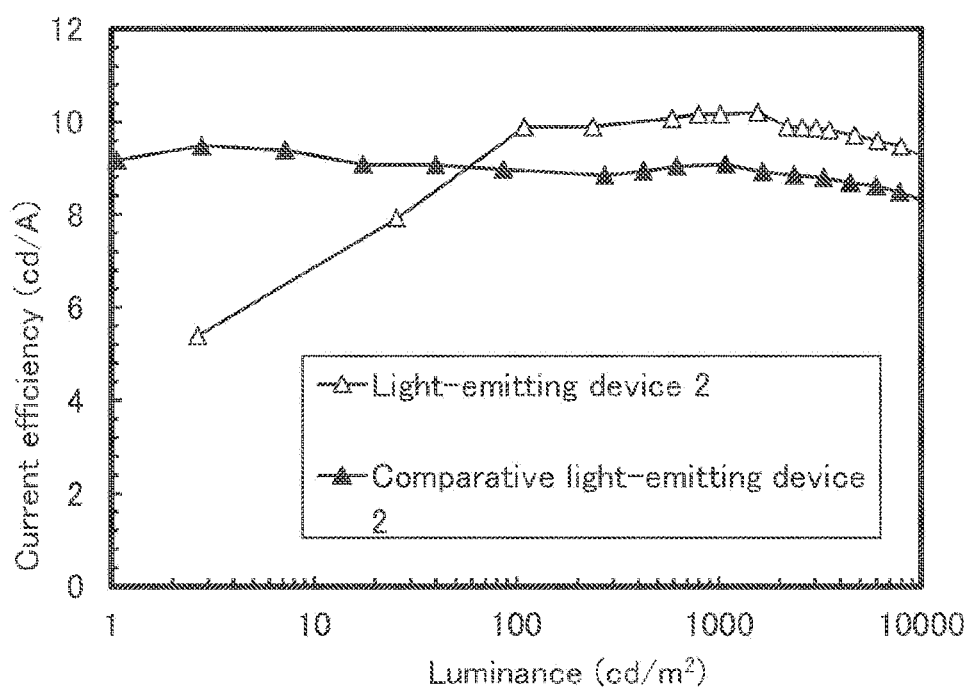
FIG. 23 shows current efficiency-luminance characteristics of the light-emitting device 2 and the comparative light-emitting device 2.
Figure 24:
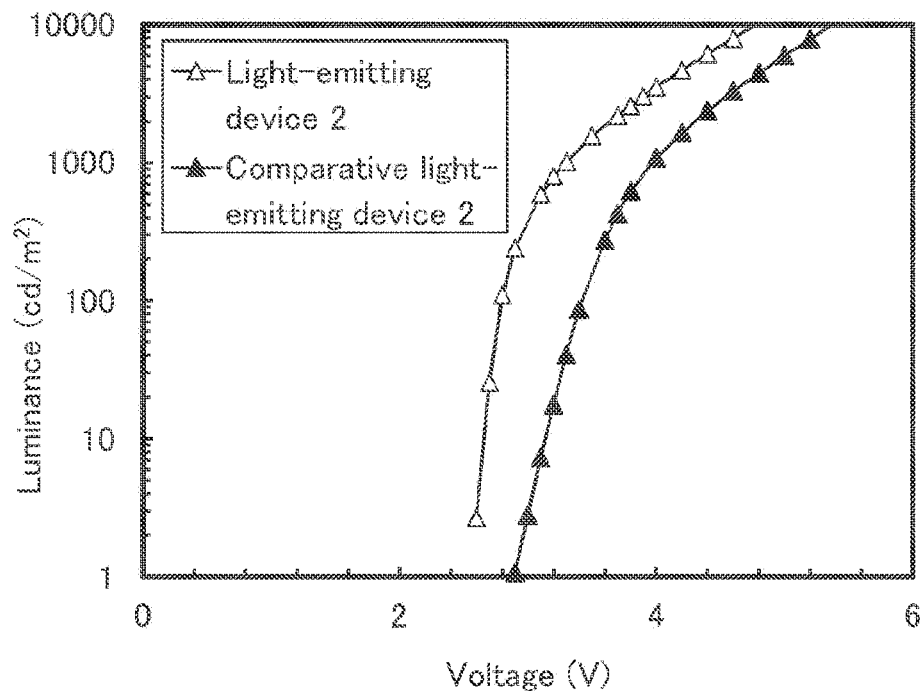
FIG. 24 shows luminance-voltage characteristics of the light-emitting device 2 and the comparative light-emitting device 2.
Figure 25:
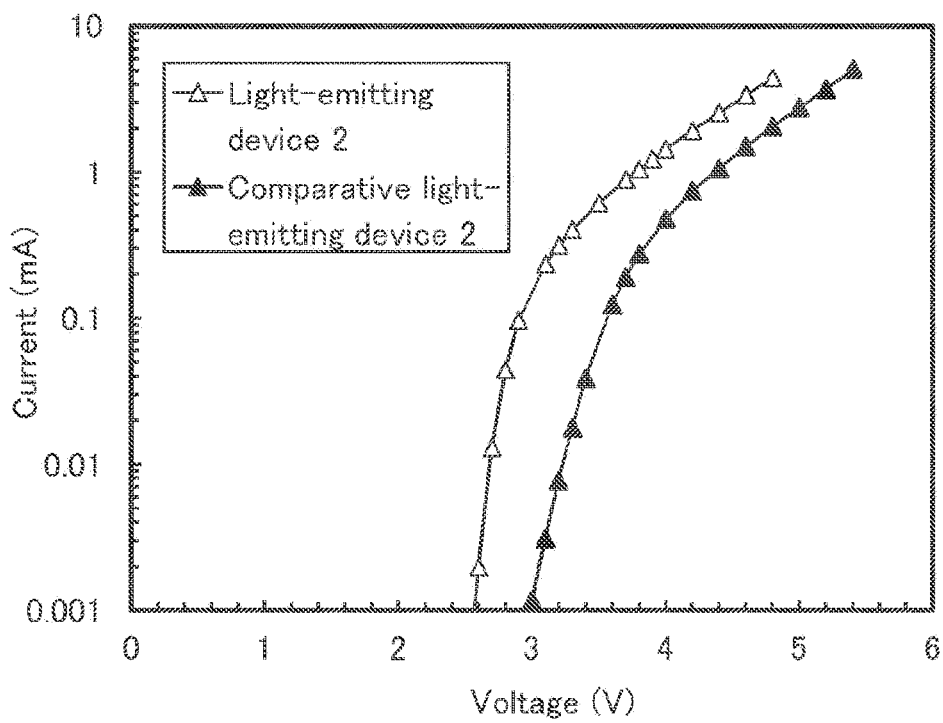
FIG. 25 shows current-voltage characteristics of the light-emitting device 2 and the comparative light-emitting device 2.
Figure 26:
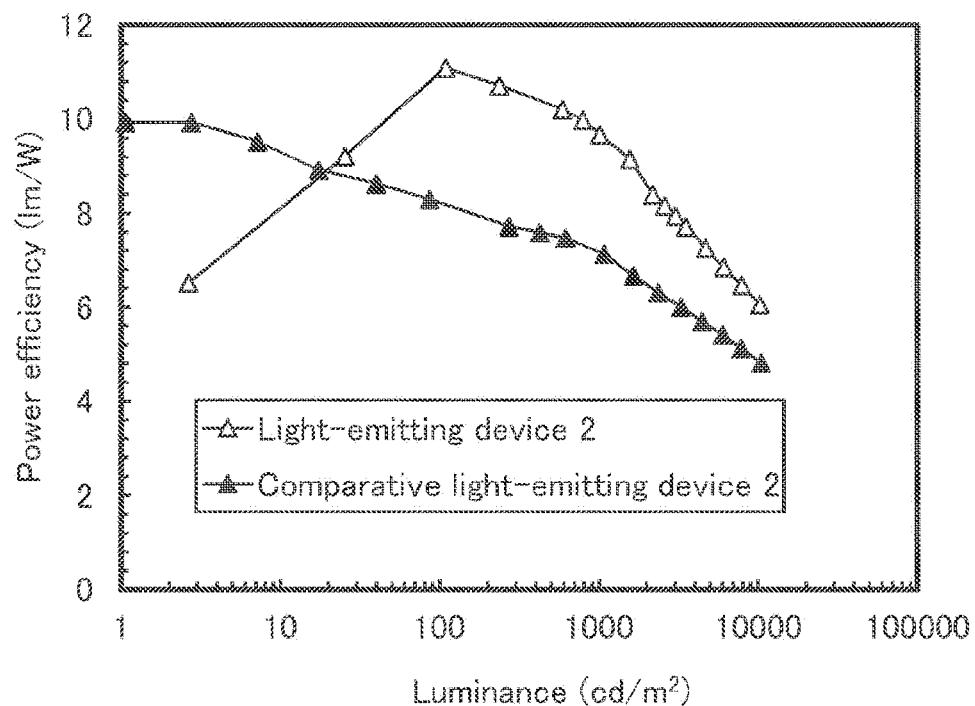
FIG. 26 shows power efficiency-luminance characteristics of the light-emitting device 2 and the comparative light-emitting device 2.
Figure 27:
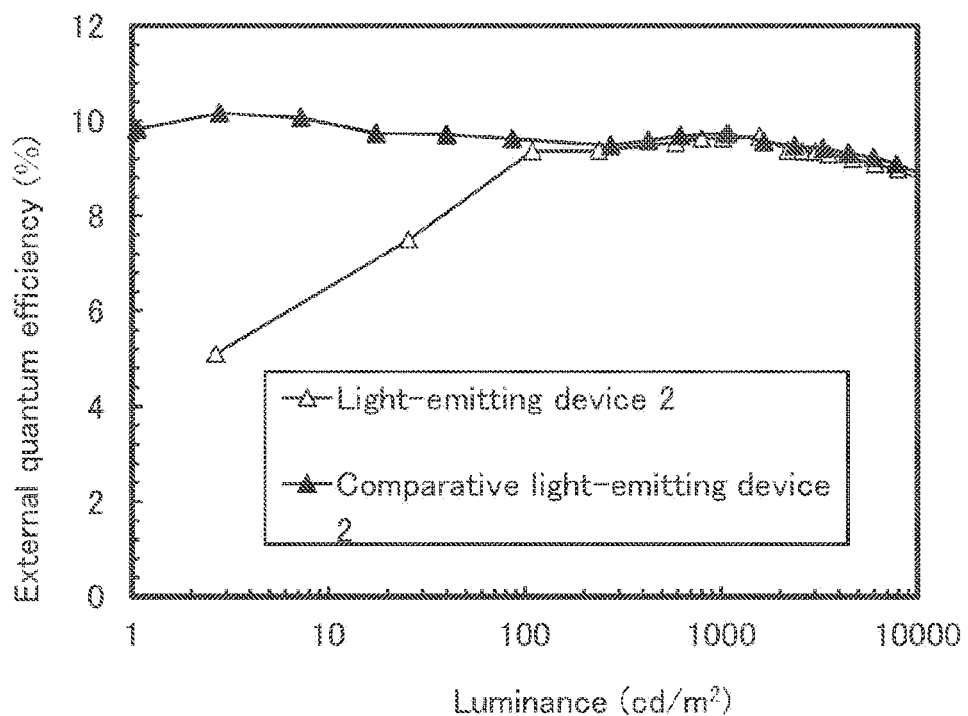
FIG. 27 shows external quantum efficiency-luminance characteristics of the light-emitting device 2 and the comparative light-emitting device 2.
Figure 28:
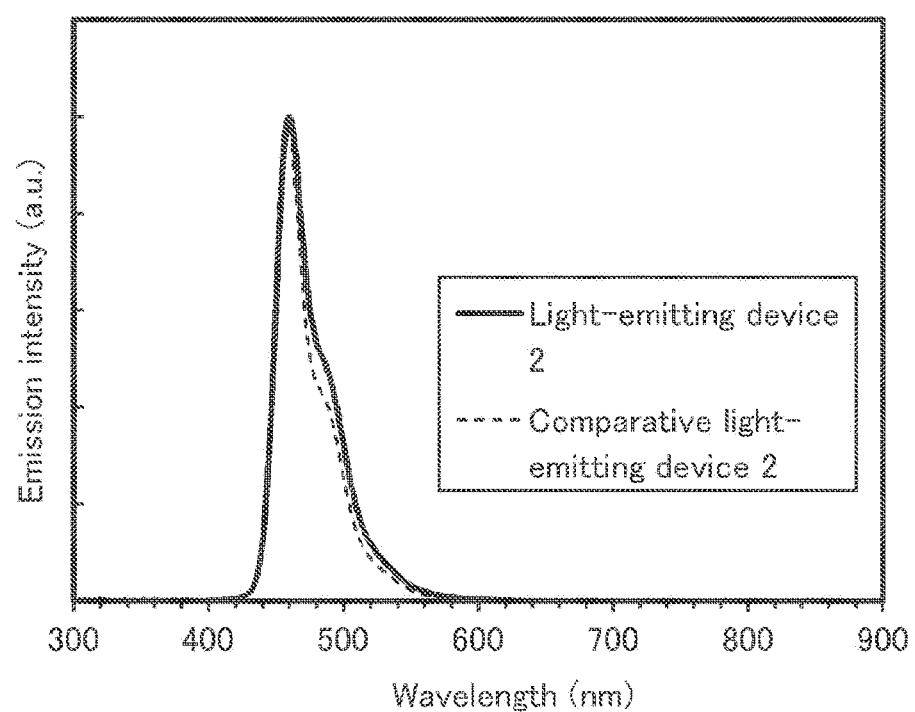
FIG. 28 shows emission spectra of the light-emitting device 2 and the comparative light-emitting device 2.

FIG. 22 shows the luminance-current density characteristics of the light-emitting device 2. FIG. 23 shows the current efficiency-luminance characteristics thereof. FIG. 24 shows the luminance-voltage characteristics thereof. FIG. 25 shows the current-voltage characteristics thereof. FIG. 26 shows the power efficiency-luminance characteristics thereof. FIG. 27 shows the external quantum efficiency-luminance characteristics thereof. FIG. 28 shows the emission spectrum thereof. Table 7 shows the main characteristics of the light-emitting device 2 at a luminance of about 1000 cd/m².

FIG. 22 to FIG. 28 and Table 7 show that the light-emitting device 2 of one embodiment of the present invention and the comparative light-emitting device 2 are blue-light-emitting devices with favorable characteristics.

Figure 29A:
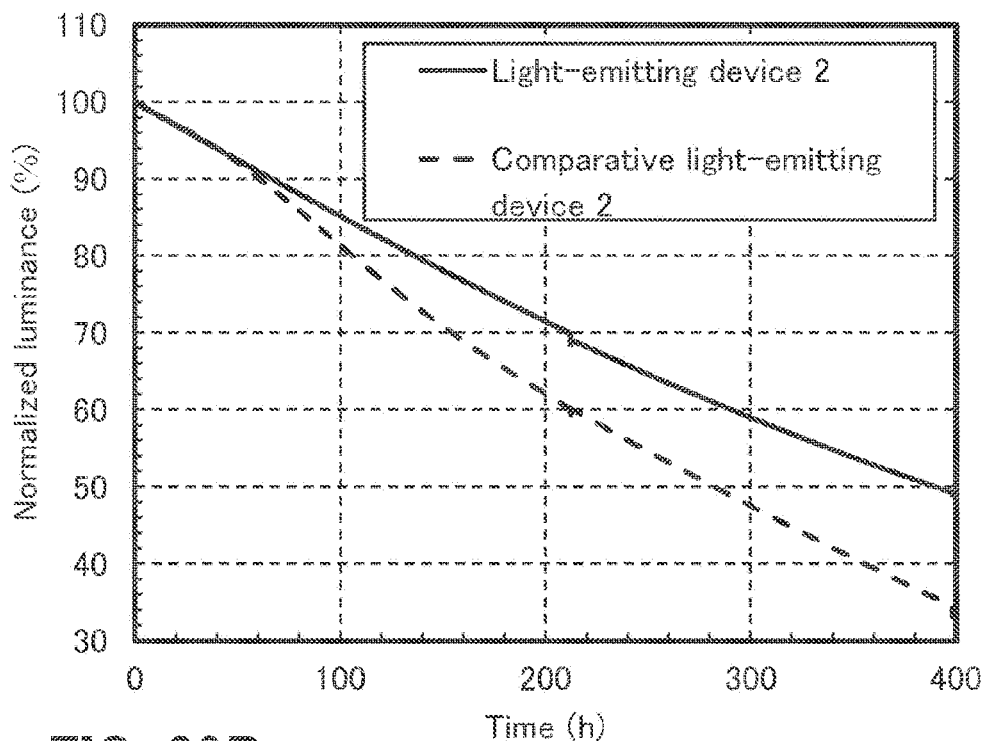
FIGS. 29A and 29B each show time dependence of normalized luminance of the light-emitting device 2 and the comparative light-emitting device 2.

FIG. 29A is a graph showing a change in luminance over driving time at a current density of 50 mA/cm² at the high temperature of 85° C. As shown in FIG. 29A, the luminance of the light-emitting device 2 decreased substantially in accordance with the single exponential function, whereas the luminance of the comparative light-emitting device 2 decreased at high speed not in accordance with the function.

Figure 29B:
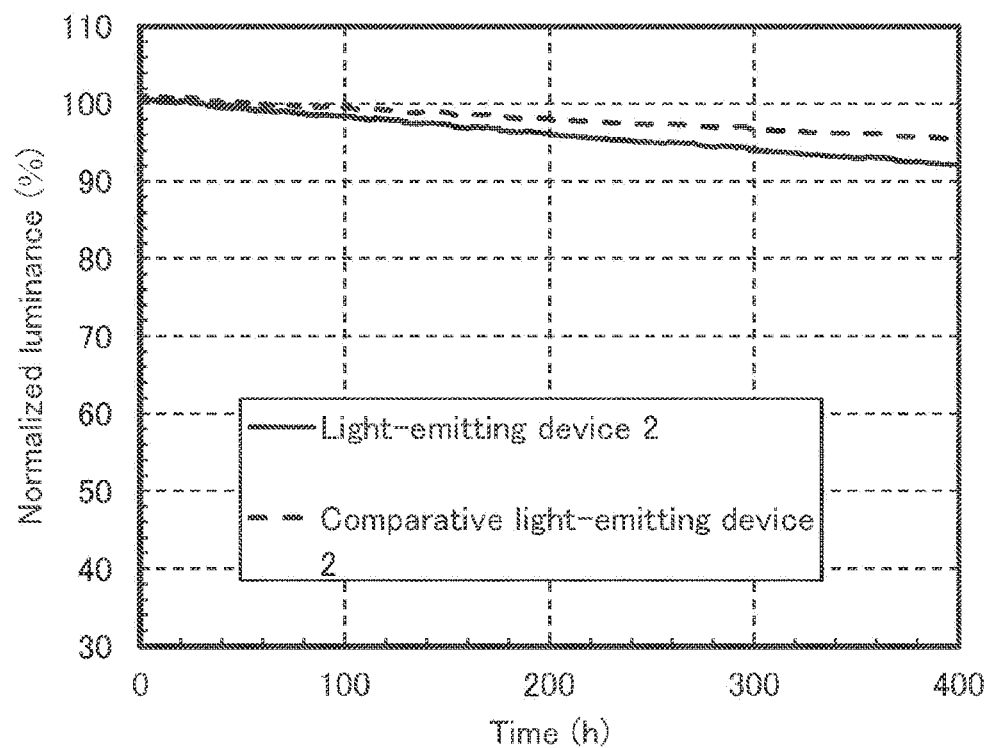

FIG. 29B is a graph showing a change in luminance over driving time at a current density of 50 mA/cm² at room temperature. At room temperature, the luminance of the light-emitting device 2 and the comparative light-emitting device 2 both decreased substantially in accordance with the single exponential function with small gradients of the degradation curves. Furthermore, the luminance of the comparative light-emitting device 2 decreased more slowly than the light-emitting device 2 at room temperature, which is opposite to the results at a high temperature of 85° C.

The host material in the light-emitting layer of the light-emitting device 2 of one embodiment of the present invention is cgDBCzPA with a HOMO level of −5.69 eV, and the material in the hole-transport layer that is in contact with the light-emitting layer is BBABnf with a HOMO level of −5.56 eV; thus, a difference therebetween is 0.13 eV. On the other hand, the host material in the light-emitting layer of the comparative light-emitting device 2 is αN-βNPAnth with a HOMO level: −5.85 eV), and thus a difference between HOMO levels of this material and the material in the second hole-transport layer is 0.29 eV.

Here, the temperature acceleration coefficients of the light-emitting devices were compared. The temperature acceleration coefficient was calculated by dividing the elapsed time taken for the luminance to decrease to 90% of the initial luminance at room temperature ($LT_{90}$ (R.T.)) by the elapsed time taken for the luminance to decrease to 90% of the initial luminance at 85° C. ($LT_{90}$ (85 deg.)). Thus, a smaller temperature acceleration coefficient indicates

TABLE 7

| | Voltage (V) | Current (mA) | Current density (mA/cm²) | Chromaticity x | Chromaticity y | Power efficiency (lm/W) | External quantum efficiency (%) |
|---|---|---|---|---|---|---|---|
| Light-emitting device 2 | 3.3 | 0.40 | 10.0 | 0.14 | 0.14 | 9.7 | 9.6 |
| Comparative Light-emitting device 2 | 4.0 | 0.47 | 11.9 | 0.14 | 0.11 | 7.1 | 9.7 | smaller degradation due to high temperature during the high-temperature driving. $LT_{90}$ (R.T.) and $LT_{90}$ (85 deg.) read from in FIGS. 29A and 29B and the temperature acceleration coefficients of the light-emitting devices are listed in the following table.

TABLE 8

| | $LT_{90}$ | | Temperature acceleration coefficient |
|---|---|---|---|
| | R.T. | 85 deg. | |
| Light-emitting device 2 | 512 | 67 | 8 |
| Comparative light-emitting device 2 | 820*[1] | 61 | 13 |

*[1]an extrapolated value

In this example, BBABnf with a HOMO level slightly deeper than that of DBfBB1TP used in Example 1 was used as the material for the hole-transport layer in contact with the light-emitting layer. As a result, the difference between HOMO levels of the host material and the material used for the hole-transport layer in contact with the light-emitting layer was smaller than that in Example 1. Also in Example 2, the light-emitting device 2, in which the difference was smaller than that in the comparative light-emitting device 2, showed more favorable results than that in the high-temperature driving test. Furthermore, a difference in temperature acceleration coefficient between the light-emitting device 2 and the comparative light-emitting device 2 was smaller than that between the light-emitting device 1 and the comparative light-emitting device 1 in Example 1.

Thus, in the comparative light-emitting device 2 in which the difference between HOMO levels of the host material and the hole-transport material used for the hole-transport layer in contact with the light-emitting layer was greater than 0.24 eV, the luminance largely decreased at high temperature with a change in the shape of the degradation curve, which showed a possibility of degradation in a different mechanism. On the other hand, in the light-emitting device 2 in which the difference was less than or equal to 0.24 eV, favorable results were obtained without such an irregularity. It was found that the difference of HOMO levels in the light-emitting device 2 was 0.13 eV, which was smaller than 0.19 eV of the light-emitting device 1 in Example 1, and the driving lifetime at 85° C. was increased accordingly in the light-emitting device 2. Thus, in one embodiment of the present invention, the difference between HOMO levels of the host material and the hole-transport material used for the hole-transport layer in contact with the light-emitting layer is further preferably less than or equal to 0.16 eV.

Example 3

In this example, light-emitting devices 3 and 4 of one embodiment of the present invention are described. Structural formulae of organic compounds used for the light-emitting devices 3 and 4 are shown below.

[Chemical Formula 5]

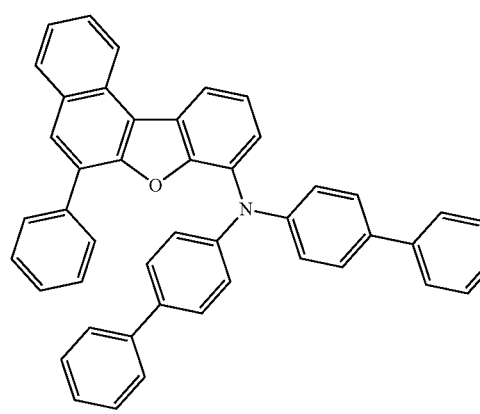

(viii)

BBABnf

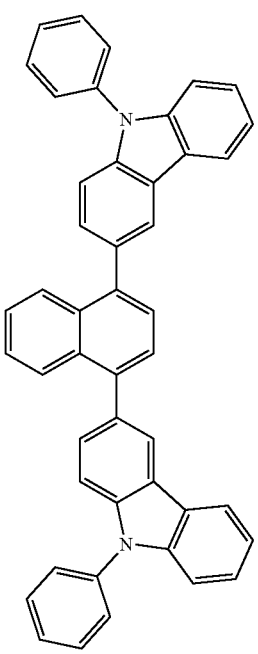

(ix)

PCzN2

-continued

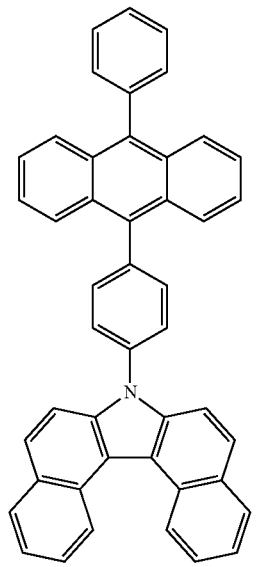
cgDBCzPA (iii)

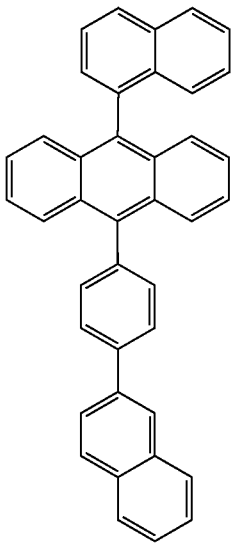
αN-βNPAnth (vii)

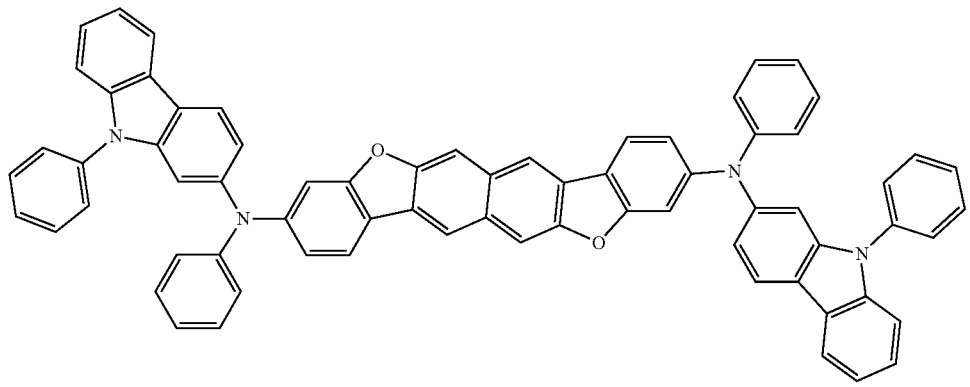
3,10PCA2Nbf(IV)-02 (iv)

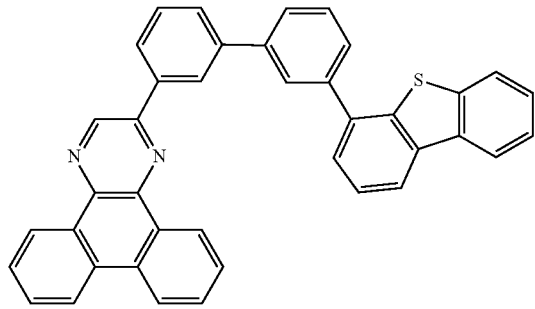
2mDBTBPDBq-II (v)

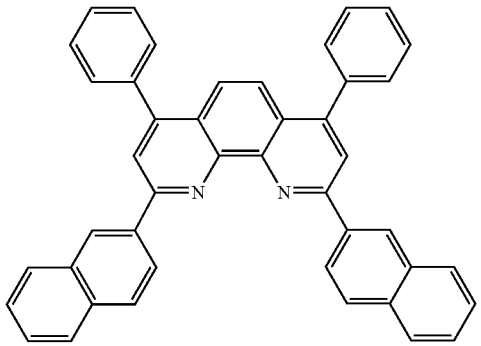
NBPhen (vi)

(Method of Fabricating Light-Emitting Device 3)

First, indium tin oxide containing silicon oxide (ITSO) was deposited over a glass substrate by a sputtering method to form the anode 101. The thickness of the anode 101 was 70 nm and the electrode area was 2 mm×2 mm.

Next, in pretreatment for forming the light-emitting device over a substrate, a surface of the substrate was washed with water and baked at 200° C. for 1 hour, and then UV ozone treatment was performed for 370 seconds.

After that, the substrate was transferred into a vacuum evaporation apparatus where the pressure was reduced to approximately $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the anode 101 was fixed to a substrate holder provided in the vacuum evaporation apparatus such that the side on which the anode 101 was formed faced downward. Then, N,N-bis(4-biphenyl)-6-phenylbenzo[b]naphtho[1,2-d]furan-8-amine (abbreviation: BBABnf) represented by Structural Formula (viii) and ALD-MP001Q (produced by Analysis Atelier Corporation, material serial No. 1S20170124) were co-evaporated to a thickness of 10 nm on the anode 101 using a resistance-heating method such that the weight ratio of BBABnf to ALD-MP001Q was 1:0.1, whereby the hole-injection layer 111 was formed.

Subsequently, over the hole-injection layer 111, BBABnf was evaporated to a thickness of 20 nm to form the first hole-transport layer 112-1, and then 3,3'-(naphthalene-1,4-diyl)bis(9-phenyl-9H-carbazole) (abbreviation: PCzN2) represented by Structural Formula (ix) was evaporated to a thickness of 10 nm to form the second hole-transport layer 112-2, whereby the hole-transport layer 112 was formed. Note that the second hole-transport layer 112-2 also functions as an electron-blocking layer.

Then, 7-[4-(10-phenyl-9-anthryl)phenyl]-7H-dibenzo[c,g]carbazole (abbreviation: cgDBCzPA) represented by Structural Formula (iii) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) represented by Structural Formula (iv) were co-evaporated to a thickness of 25 nm such that the weight ratio of cgDBCzPA to 3,10PCA2Nbf(IV)-02 was 1:0.015, whereby the light-emitting layer 113 was formed.

Then, over the light-emitting layer 113, 2-[3'-(dibenzothiophen-4-yl)biphenyl-3-yl]dibenzo[f,h]quinoxaline (abbreviation: 2mDBTBPDBq-II) represented by Structural Formula (v) was evaporated to a thickness of 15 nm, and subsequently 2,9-bis(naphthalen-2-yl)-4,7-diphenyl-1,10-phenanthroline (abbreviation: NBPhen) represented by Structural Formula (vi) was evaporated to a thickness of 10 nm, whereby the electron-transport layer 114 was formed.

After the formation of the electron-transport layer 114, lithium fluoride (LiF) was evaporated to a thickness of 1 nm to form the electron-injection layer 115. Then, aluminum was evaporated to a thickness of 200 nm to form the cathode 102. Thus, the light-emitting device 3 of this example was fabricated.

(Method of Fabricating Light-Emitting Device 4)

The light-emitting device 4 was fabricated in a manner similar to that for the light-emitting device 3 except that 9-(1-naphthyl)-10-[4-(2-naphthyl)phenyl]anthracene (abbreviation: αN-βNPAnth) represented by Structural Formula (vii) was used instead of cgDBCzPA of the light-emitting device 3.

The device structures of the light-emitting devices 3 and 4 are listed in the following table.

TABLE 9

| | Hole-injection layer | Hole-transport layer | | Light-emitting layer | Electron-transport layer | | Electron-injection layer |
|---|---|---|---|---|---|---|---|
| | | 1 | 2 | | | | |
| | 10 nm | 20 nm | 10 nm | 25 nm | 15 nm | 10 nm | 1 nm |
| Light-emitting device 3 | BBABnf:ALD-MP001Q (1:0.1) | BBABnf | PCzN2 | *5 | 2mDBTBPDBq-II | NBPhen | LiF |
| Light-emitting device 4 | | | | *6 | | | |

*5 cgDBCzPA: 3,10PCA2Nbf(IV)-02 (1:0.015)
*6 αN-βNPAnth: 3,10PCA2Nbf(IV)-02 (1:0.015)

The HOMO levels of the organic compounds used in this example are listed in the following table.

TABLE 10

| | HOMO level (eV) |
|---|---|
| BBABnf | −5.56 |
| PCzN2 | −5.71 |
| cgDBCzPA | −5.69 |
| αN-βNPAnth | −5.85 |

These light-emitting devices were sealed using a glass substrate in a glove box containing a nitrogen atmosphere so as not to be exposed to the air (a sealing material was applied to surround the element and UV treatment and heat treatment at 80° C. for 1 hour were performed at the time of sealing). Then, the initial characteristics and reliability of the light-emitting devices were measured. Note that the measurement was performed at room temperature.

Figure 30:
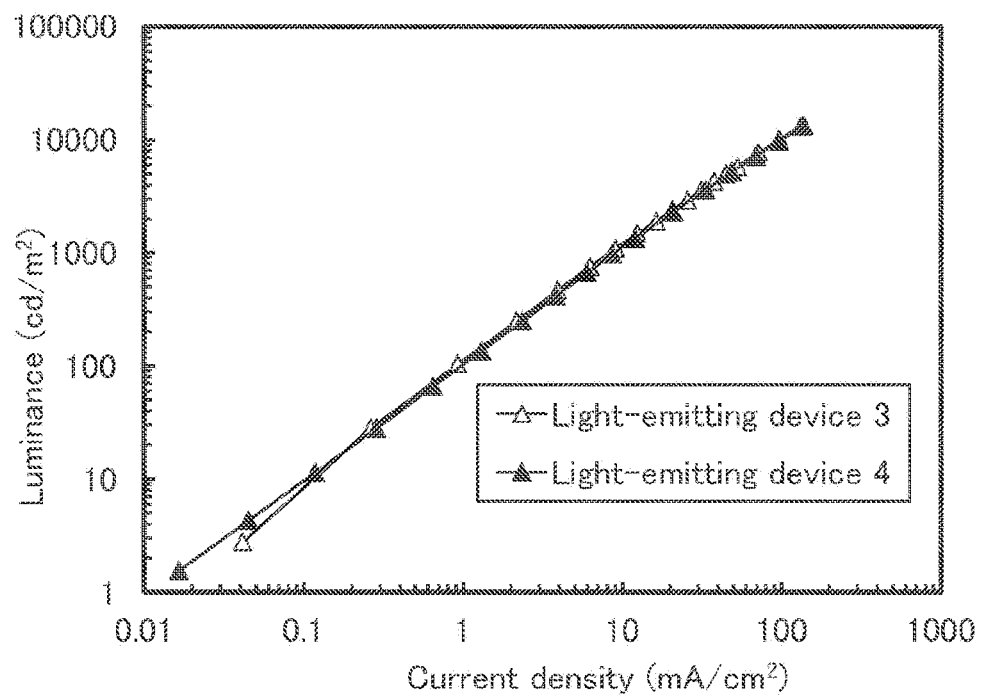
FIG. 30 shows luminance-current density characteristics of a light-emitting device 3 and a light-emitting device 4.
Figure 31:
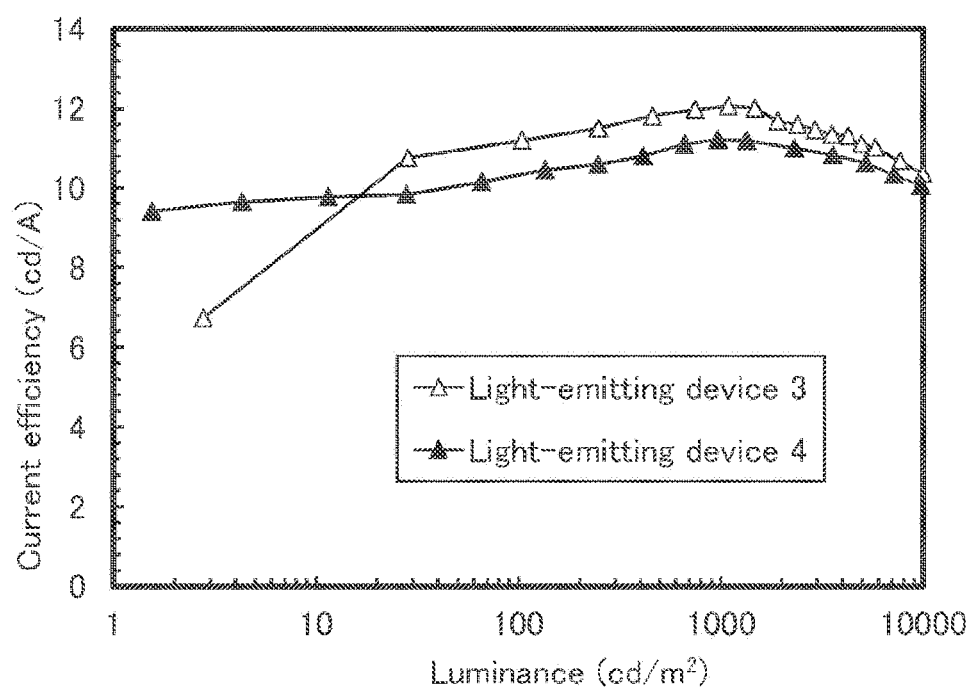
FIG. 31 shows current efficiency-luminance characteristics of the light-emitting device 3 and the light-emitting device 4.
Figure 32:
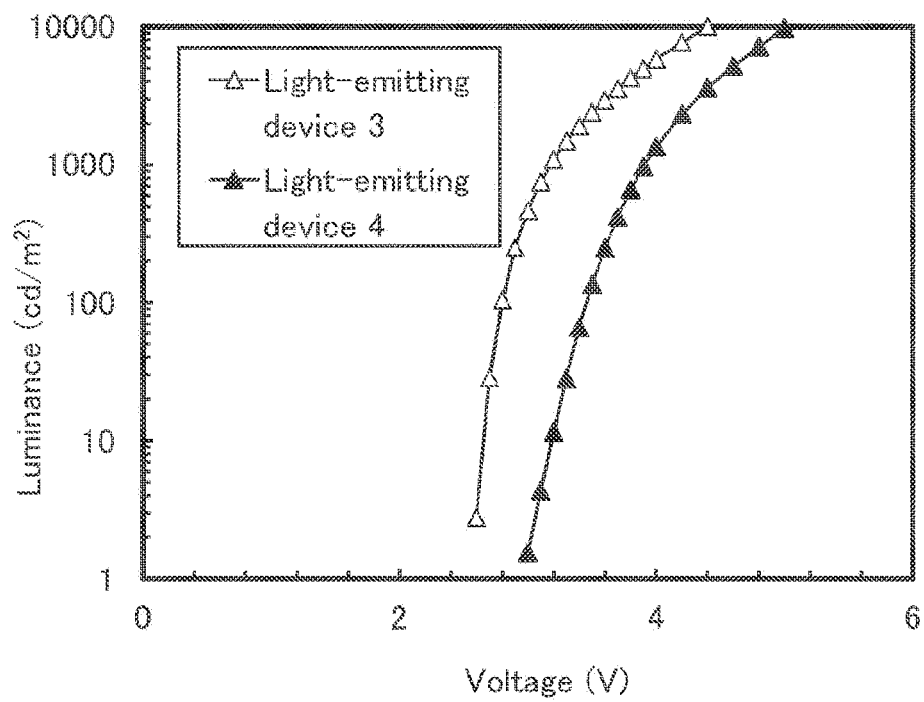
FIG. 32 shows luminance-voltage characteristics of the light-emitting device 3 and the light-emitting device 4.
Figure 33:
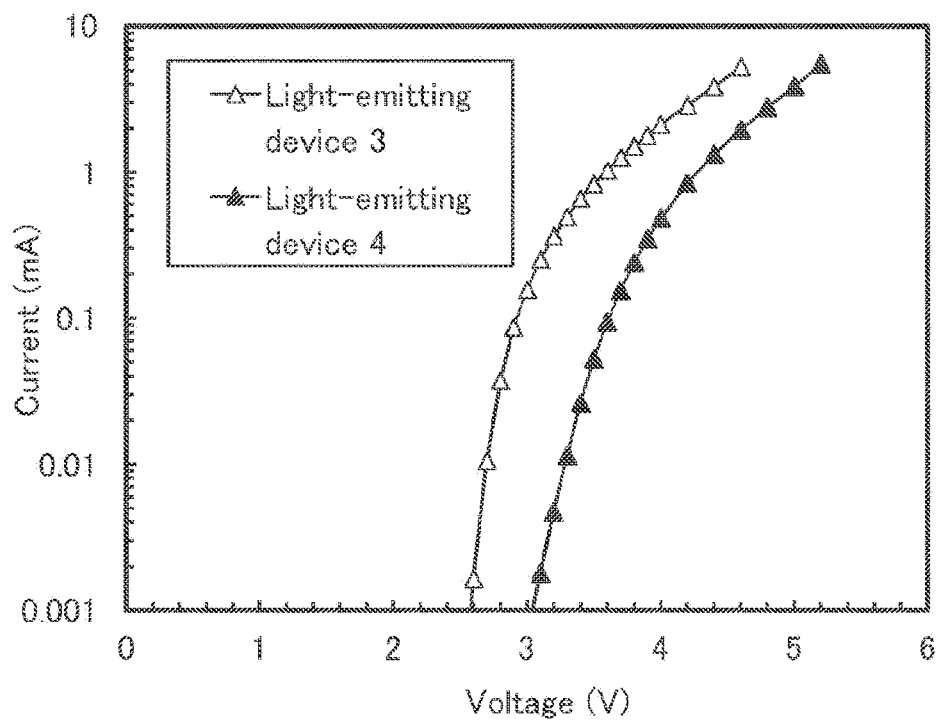
FIG. 33 shows current-voltage characteristics of the light-emitting device 3 and the light-emitting device 4.
Figure 34:
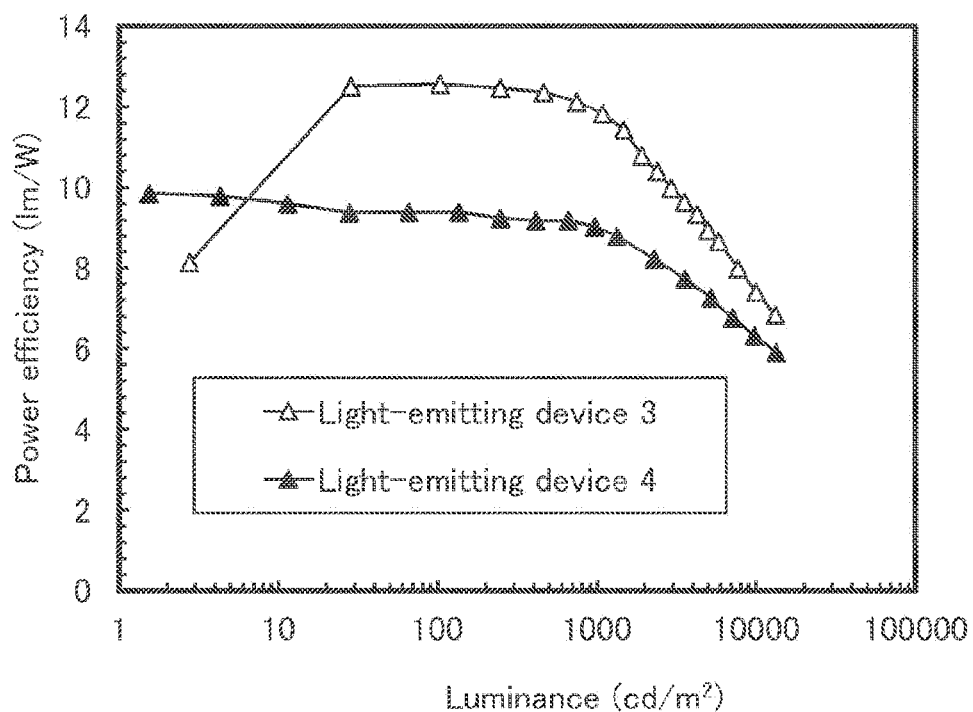
FIG. 34 shows power efficiency-luminance characteristics of the light-emitting device 3 and the light-emitting device 4.
Figure 35:
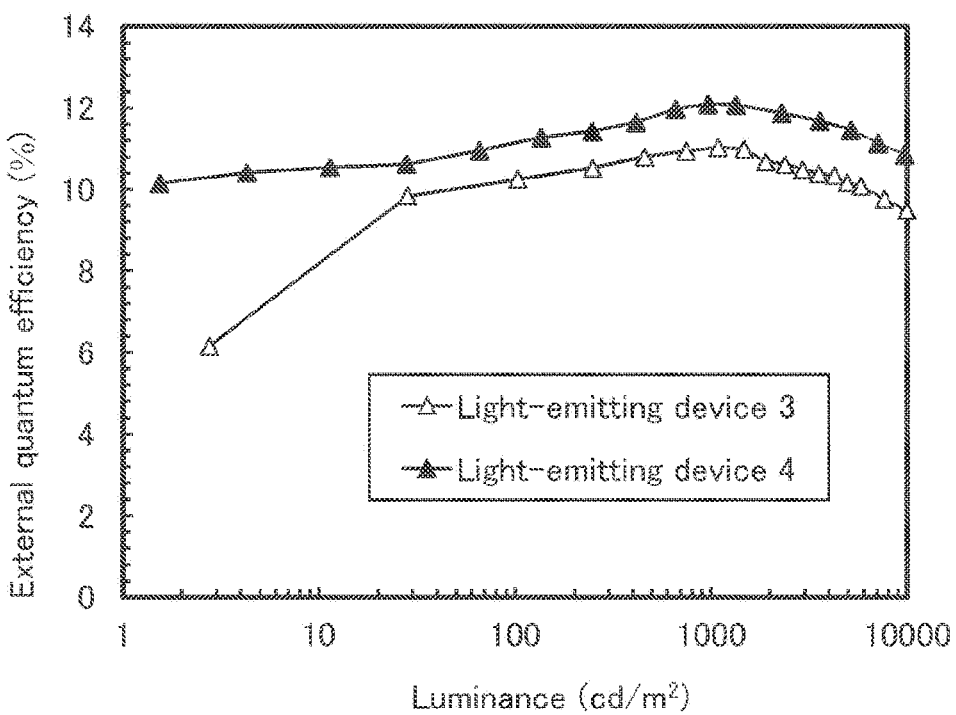
FIG. 35 shows external quantum efficiency-luminance characteristics of the light-emitting device 3 and the light-emitting device 4.
Figure 36:
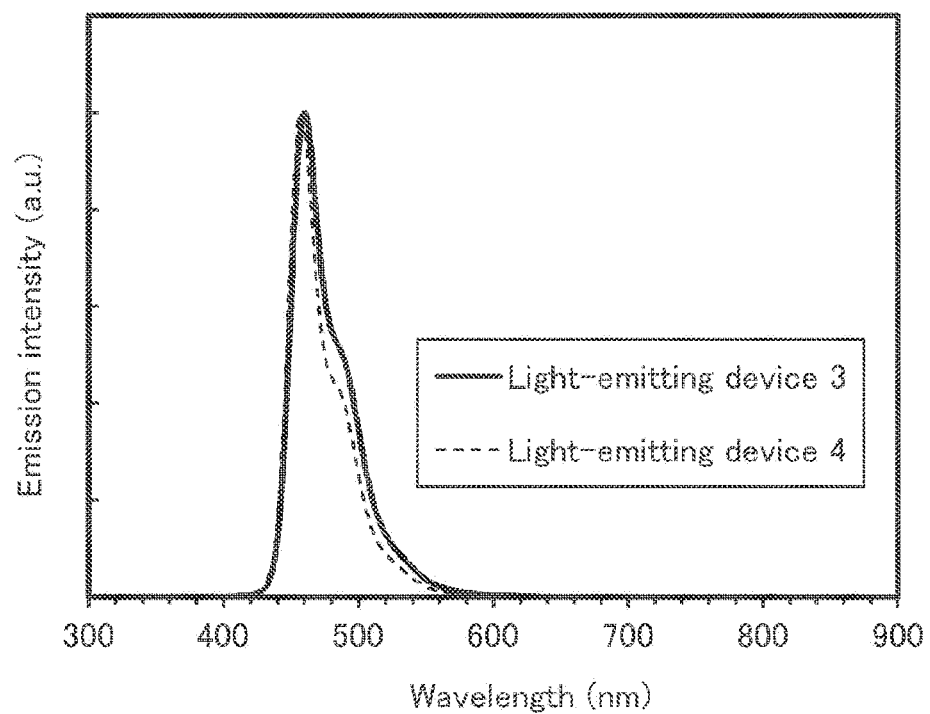
FIG. 36 shows emission spectra of the light-emitting device 3 and the light-emitting device 4.

FIG. 30 shows the luminance-current density characteristics of the light-emitting devices 3 and 4. FIG. 31 shows the current efficiency-luminance characteristics thereof. FIG. 32 shows the luminance-voltage characteristics thereof. FIG. 33 shows the current-voltage characteristics thereof. FIG. 34 shows the power efficiency-luminance characteristics thereof. FIG. 35 shows the external quantum efficiency-luminance characteristics thereof. FIG. 36 shows the emission spectra thereof. Table 11 shows the main characteristics of the light-emitting devices 3 and 4 at a luminance of about 1000 cd/m$^2$.

TABLE 11

| | Voltage (V) | Current (mA) | Current density (mA/cm$^2$) | Chromaticity x | Chromaticity y | Power efficiency (lm/W) | External quantum efficiency (%) |
|---|---|---|---|---|---|---|---|
| Light-emitting device 3 | 3.2 | 0.36 | 9.0 | 0.14 | 0.14 | 11.8 | 11.0 |

TABLE 11-continued

| | Voltage (V) | Current (mA) | Current density (mA/cm$^2$) | Chromaticity x | Chromaticity y | Power efficiency (lm/W) | External quantum efficiency (%) |
|---|---|---|---|---|---|---|---|
| Light-emitting device 4 | 3.9 | 0.35 | 8.6 | 0.14 | 0.11 | 9.0 | 12.1 |

FIG. 30 to FIG. 36 and Table 11 show that the light-emitting devices 3 and 4 of one embodiment of the present invention are blue light-emitting devices with favorable characteristics.

Figure 37A:
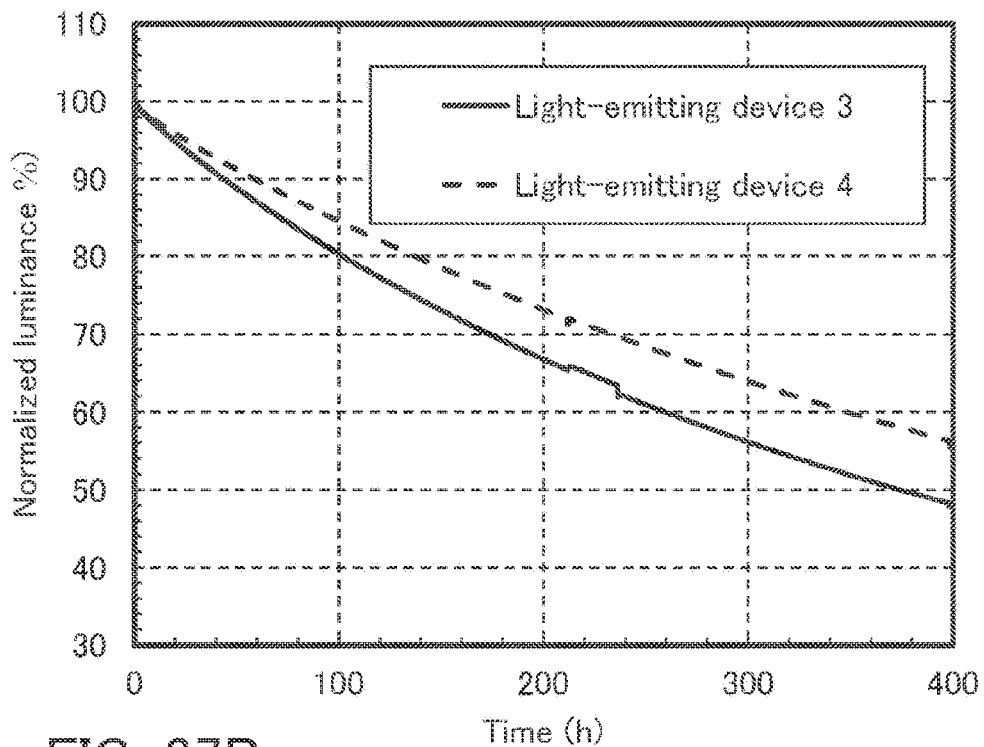
FIGS. 37A and 37B each show time dependence of normalized luminance of the light-emitting device 3 and the light-emitting device 4.

FIG. 37A is a graph showing a change in luminance over driving time at a high temperature of 85° C. and a current density of 50 mA/cm$^2$. As shown in FIG. 37A, the luminances of the light-emitting devices 3 and 4 both decrease with time substantially in accordance with the single exponential function.

Figure 37B:
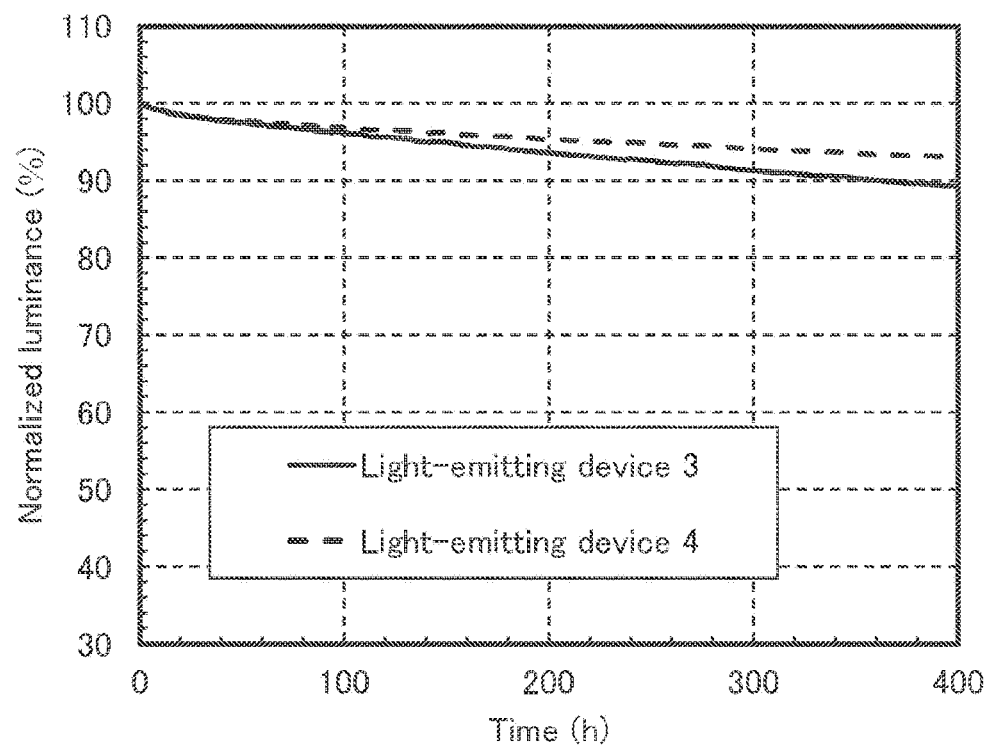

FIG. 37B is a graph showing a change in luminance over driving time at a current density of 50 mA/cm$^2$ at room temperature. At room temperature, the luminances of the light-emitting devices 3 and 4 both decreased with time substantially in accordance with the single exponential function with small gradients of the degradation curves.

The host material in the light-emitting layer of the light-emitting device 3 of one embodiment of the present invention is cgDBCzPA with a HOMO level of −5.69 eV, and the material in the hole-transport layer that is in contact with the light-emitting layer is PCzN2 with a HOMO level of −5.71 eV; thus, a difference of HOMO levels therebetween is 0.02 eV. On the other hand, the host material in the light-emitting layer of the light-emitting device 4 is αN-βNPAnth with a HOMO level of −5.85 eV, and thus a difference between HOMO levels of this material and the material in the second hole-transport layer is 0.14 eV.

Here, the temperature acceleration coefficients of the light-emitting devices were compared. The temperature acceleration coefficient was calculated by dividing the elapsed time taken for the luminance to decrease to 90% of the initial luminance at room temperature (LT$_{90}$ (R.T.)) by the elapsed time taken for the luminance to decrease to 90% of the initial luminance at 85° C. (LT$_{90}$ (85 deg.)). Thus, a smaller temperature acceleration coefficient indicates smaller degradation due to high temperature during the high-temperature driving. LT$_{90}$ (R.T.) and LT$_{90}$ (85 deg.) read from FIGS. 37A and 37B and the temperature acceleration coefficients of the light-emitting devices are listed in the following table.

TABLE 12

| | LT$_{90}$ | | Temperature acceleration |
|---|---|---|---|
| | R.T. | 85 deg. | coefficient |
| Light-emitting device 3 | 363 | 44 | 8 |
| Light-emitting device 4 | 640*$^2$ | 59 | 11 |

*$^2$an extrapolated value

In this example, PCzN2 with a deep HOMO level is used as the material for the hole-transport layer that is in contact with the light-emitting layer, and thus the difference between HOMO levels of the host material and PCzN2 is sufficiently small.

When the comparative light-emitting device 1 of Example 1, the comparative light-emitting device 2 of Example 2, and the light-emitting device 4 of this example, in each of which the same host material was used, were compared, it was found that smaller decrease in luminance and longer driving lifetime were obtained at high temperature as the HOMO level of the material for the hole-transport layer in contact with the light-emitting layer was deeper, i.e., as the difference between HOMO levels of the host material and the material for the hole-transport layer was smaller.

As described above, it was found that the light-emitting devices 3 and 4, in which the difference between HOMO levels of the host material and the hole-transport material used for the hole-transport layer in contact with the light-emitting layer was less than or equal to 0.24 eV, had a small temperature acceleration coefficient and a favorable driving lifetime at high temperature. Note that the light-emitting devices 3 and 4 had a smaller difference in HOMO levels than that of the light-emitting device 1 in Example 1, which is 0.20 eV, and accordingly had an improved driving lifetime at 85° C.

Reference Example

In this reference example, methods of calculating the HOMO levels and the LUMO levels of the organic compounds used in the examples are described.

The HOMO level and the LUMO level can be calculated through a cyclic voltammetry (CV) measurement.

An electrochemical analyzer (ALS model 600A or 600C, manufactured by BAS Inc.) was used as the measurement apparatus. A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was conducted at room temperature (20° C. to 25° C.). In addition, the scan speed in the CV measurement was fixed to 0.1 V/sec, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae:

$$HOMO \text{ level } [eV] = -4.94 - Ea$$

-continued and $$LUMO\ \text{level}\ [eV] = -4.94 - Ec.$$

REFERENCE NUMERALS

101: anode, 102: cathode, 103: EL layer, 111: hole-injection layer, 112: hole-transport layer, 112-1: first hole-transport layer, 112-2: second hole-transport layer, 113: light-emitting layer, 114: electron-transport layer, 115: electron-injection layer, 116: charge generation layer, 117: p-type layer, 118: electron-relay layer, 119: electron-injection buffer layer, 400: substrate, 401: anode, 403: EL layer, 404: cathode, 405: sealing material, 406: sealing material, 407: sealing substrate, 412: pad, 420: IC chip, 501: anode, 502: cathode, 511: first light-emitting unit, 512: second light-emitting unit, 513: charge generation layer, 601: driver circuit portion (source line driver circuit), 602: pixel portion, 603: driver circuit portion (gate line driver circuit), 604: sealing substrate, 605: sealing material, 607: space, 608: wiring, 609: FPC (flexible printed circuit), 610: element substrate, 611: switching FET, 612: current controlling FET, 613: anode, 614: insulator, 616: EL layer, 617: cathode, 618: light-emitting device, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: anode, 1024R: anode, 1024G: anode, 1024B: anode, 1025: partition, 1028: EL layer, 1029: cathode, 1031: sealing substrate, 1032: sealing material, 1033: transparent base material, 1034R: red coloring layer, 1034G: green coloring layer, 1034B: blue coloring layer, 1035: black matrix, 1036: overcoat layer, 1037: third interlayer insulating film, 1040: pixel portion, 1041: driver circuit portion, 1042: peripheral portion, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5002: second display portion, 5003: speaker, 5004: LED lamp, 5005: control key, 5006: connection terminal, 5007: sensor, 5008: microphone, 5012: support, 5013: earphone, 5100: cleaning robot, 5101: display, 5102: camera, 5103: brush, 5104: operation button, 5150: personal digital assistant, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 9310: personal digital assistant, 9311: display panel, 9313: hinge, and 9315: housing.

This application is based on Japanese Patent Application Serial No. 2019-008234 filed with Japan Patent Office on Jan. 22, 2019, the entire contents of which are hereby incorporated by reference.

The invention claimed is:

1. A light-emitting device comprising:
an anode;
a cathode; and
an EL layer between the anode and the cathode,
wherein the EL layer comprises a first layer, a second layer, a third layer, and a light-emitting layer in this order from the anode side,
wherein the first layer comprises a first organic compound and a second organic compound,
wherein the second layer comprises a third organic compound,
wherein the third layer comprises a fourth organic compound,
wherein the light-emitting layer comprises a fifth organic compound and a light-emitting substance,
wherein the first organic compound comprises at least one of a cyano group and a halogen group, and
wherein a difference between a HOMO level of the fourth organic compound and a HOMO level of the fifth organic compound is less than or equal to 0.24 eV.

2. A light-emitting device comprising:
an anode;
a cathode; and
an EL layer between the anode and the cathode,
wherein the EL layer comprises a first layer, a second layer, and a light-emitting layer in this order from the anode side,
wherein the first layer comprises a first organic compound and a second organic compound,
wherein the second layer comprises a third organic compound,
wherein the light-emitting layer comprises a fourth organic compound and a light-emitting substance,
wherein the first organic compound comprises at least one of a cyano group and a halogen group,
wherein a HOMO level of the second organic compound is greater than or equal to −5.7 eV and less than or equal to −5.4 eV, and
wherein a difference between a HOMO level of the third organic compound and a HOMO level of the fourth organic compound is less than or equal to 0.24 eV.

3. The light-emitting device according to claim 1, wherein a HOMO level of the second organic compound is greater than or equal to −5.7 eV and less than or equal to −5.4 eV.

4. The light-emitting device according to claim 1, wherein the HOMO level of the fifth organic compound is less than or equal to −5.75 eV.

5. The light-emitting device according to claim 1, wherein the fifth organic compound does not comprise a heteroaromatic ring in a molecular structure.

6. The light-emitting device according to claim 1, wherein the fifth organic compound is formed of only hydrocarbon.

7. The light-emitting device according to claim 1, wherein the difference between the HOMO level of the fourth organic compound and the HOMO level of the fifth organic compound is less than or equal to 0.20 eV.

8. The light-emitting device according to claim 1, wherein the difference between the HOMO level of the fourth organic compound and the HOMO level of the fifth organic compound is less than or equal to 0.16 eV.

9. The light-emitting device according to claim 1, wherein the light-emitting substance exhibits fluorescence with an emission peak wavelength of less than or equal to 480 nm.

10. The light-emitting device according to claim 1, wherein the light-emitting substance comprises a naphtho-bisbenzofuran skeleton.

11. The light-emitting device according to claim 1, wherein the light-emitting substance is a phosphorescent substance.

12. A light-emitting apparatus comprising:
the light-emitting device according to claim 1; and
at least one of a transistor and a substrate.

13. The light-emitting device according to claim 2, wherein the HOMO level of the fourth organic compound is less than or equal to −5.75 eV.

14. The light-emitting device according to claim 2, wherein the fourth organic compound does not comprise a heteroaromatic ring in a molecular structure.

15. The light-emitting device according to claim 2, wherein the fourth organic compound is formed of only hydrocarbon.

16. The light-emitting device according to claim 2, wherein the difference between the HOMO level of the third organic compound and the HOMO level of the fourth organic compound is less than or equal to 0.20 eV.

17. The light-emitting device according to claim 2, wherein the difference between the HOMO level of the third organic compound and the HOMO level of the fourth organic compound is less than or equal to 0.16 eV.

18. The light-emitting device according to claim 2, wherein the light-emitting substance exhibits fluorescence with an emission peak wavelength of less than or equal to 480 nm.

19. The light-emitting device according to claim 2, wherein the light-emitting substance comprises a naphtho-bisbenzofuran skeleton.

20. The light-emitting device according to claim 2, wherein the light-emitting substance is a phosphorescent substance.

21. A light-emitting apparatus comprising:
the light-emitting device according to claim 2; and
at least one of a transistor and a substrate.

* * * * *